(12) United States Patent
Iijima

(10) Patent No.: US 7,700,942 B2
(45) Date of Patent: Apr. 20, 2010

(54) SEMICONDUCTOR DEVICE INCLUDING AN EMBEDDED CONTACT PLUG

(75) Inventor: Shinpei Iijima, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/132,948

(22) Filed: Jun. 4, 2008

(65) Prior Publication Data

US 2008/0296666 A1    Dec. 4, 2008

(30) Foreign Application Priority Data

Jun. 4, 2007  (JP) ............................ 2007-147852

(51) Int. Cl.
*H01L 31/00* (2006.01)
*H01L 21/336* (2006.01)
(52) U.S. Cl. ..................... 257/27; 438/197
(58) Field of Classification Search ............ 257/27, 257/327, 296, E27.089, E21.646; 438/197, 438/301, 239; 710/1
See application file for complete search history.

(56) References Cited

U.S. PATENT DOCUMENTS

| | | | |
|---|---|---|---|
| 6,448,597 B1* | 9/2002 | Kasai et al. | 257/295 |
| 2003/0122212 A1* | 7/2003 | Herzum et al. | 257/503 |
| 2004/0015613 A1* | 1/2004 | Ikeda | 710/1 |
| 2005/0098850 A1* | 5/2005 | Kim et al. | 257/510 |

FOREIGN PATENT DOCUMENTS

| | | |
|---|---|---|
| JP | 05218415 | 8/1993 |
| JP | 2002118255 | 4/2002 |
| JP | 2005-150742 | 6/2005 |

* cited by examiner

*Primary Examiner*—Thomas L Dickey
*Assistant Examiner*—Nikolay Yushin
(74) *Attorney, Agent, or Firm*—Sughrue Mion, PLLC

(57) ABSTRACT

A semiconductor device includes an active area isolated by an isolation area on a semiconductor substrate. A transistor includes a gate electrode extending across the active area, source/drain regions formed in the active area on both sides of the gate electrode, and impurity-containing contact plugs connected to the source/drain regions. The source/drain regions are formed by thermal diffusion of impurities from the impurity-containing contact plugs toward the active area.

8 Claims, 20 Drawing Sheets

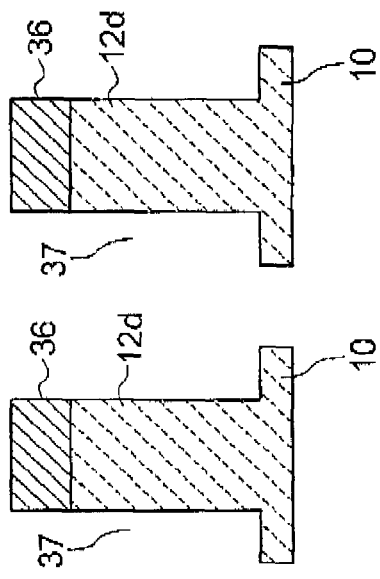
FIG. 3
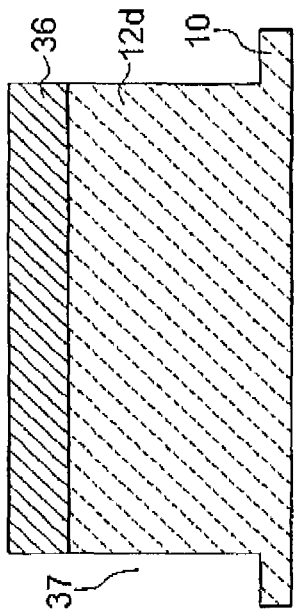
FIG. 3A   FIG. 3B
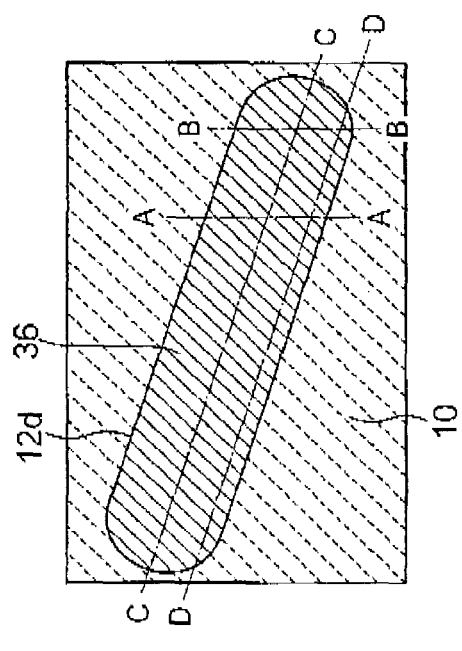
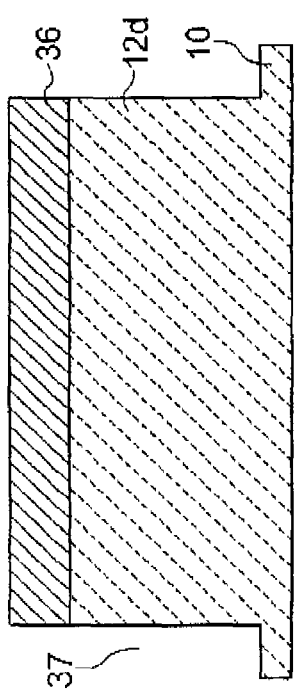
FIG. 3C
FIG. 3D

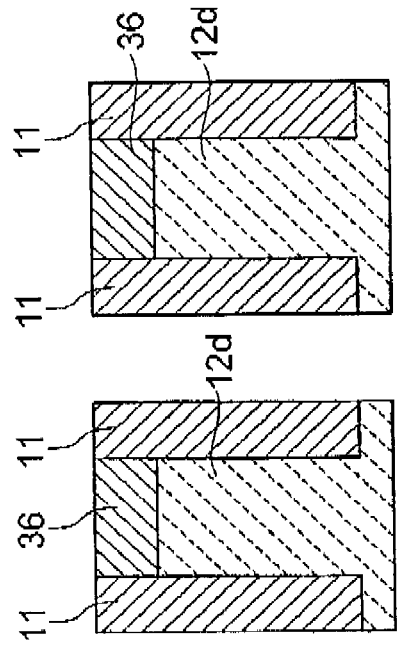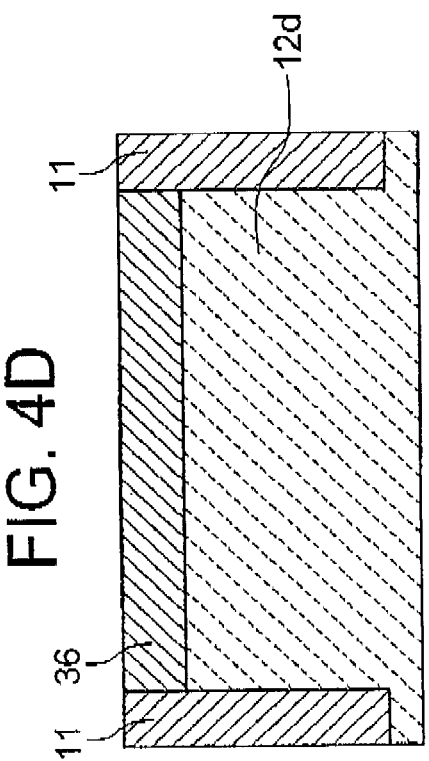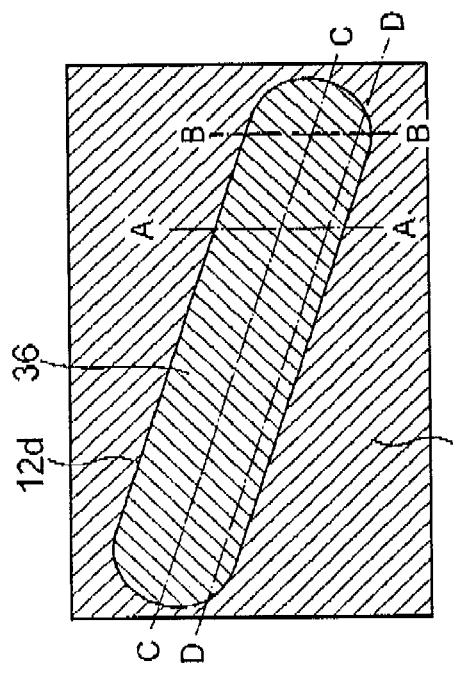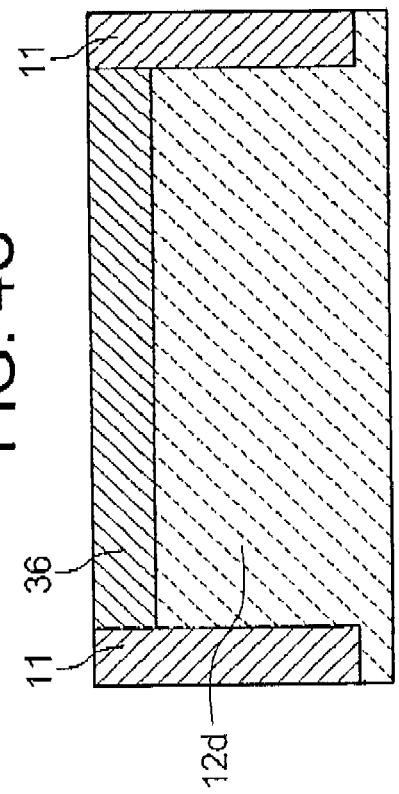

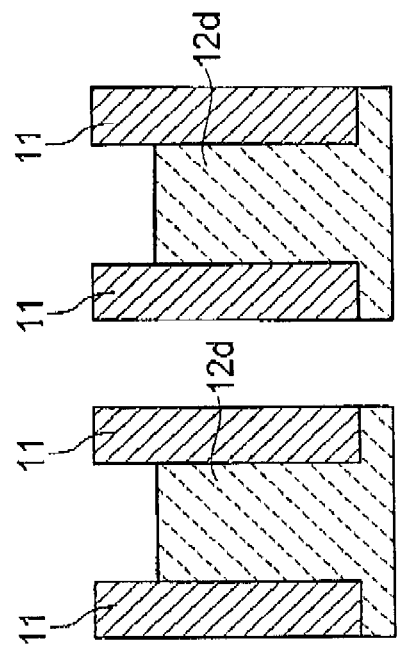
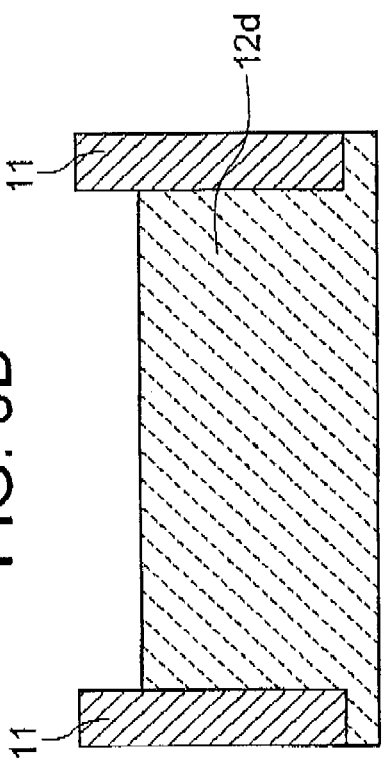
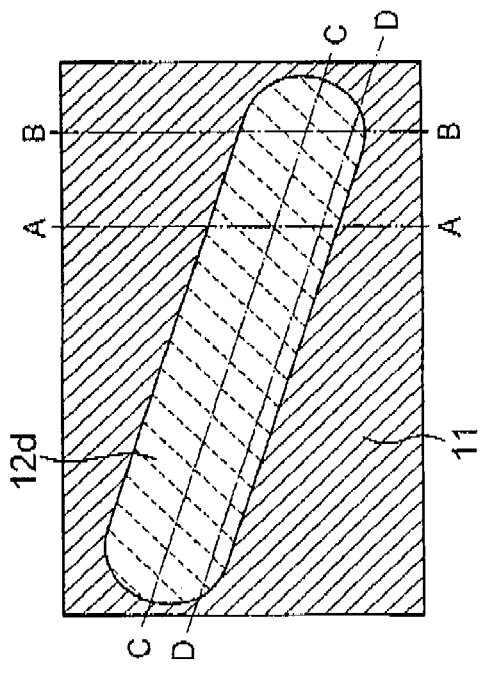
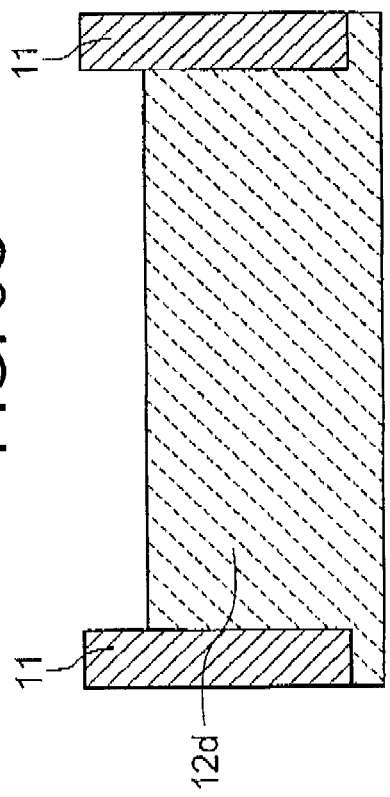

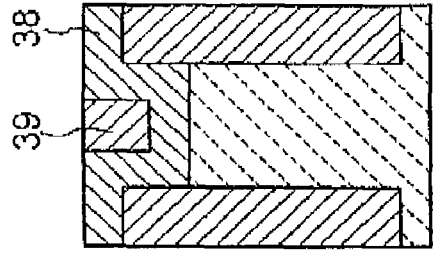
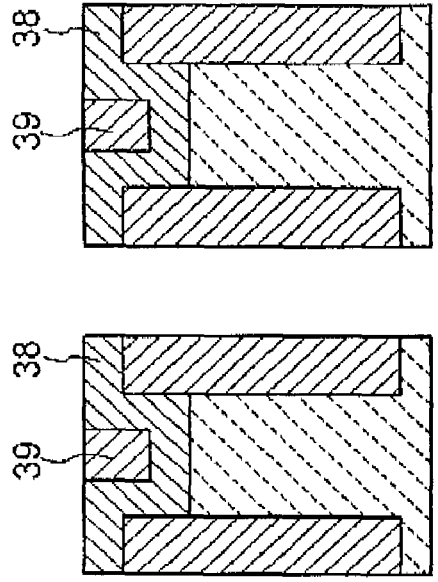
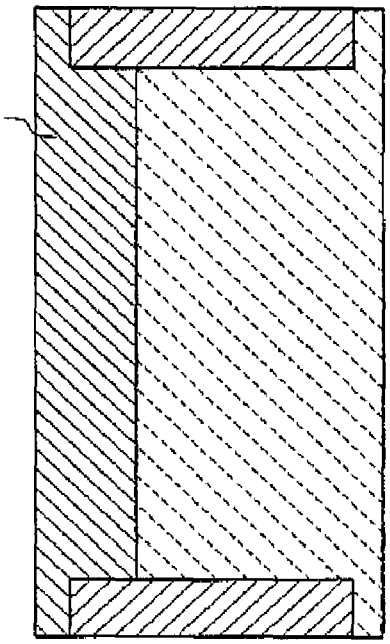
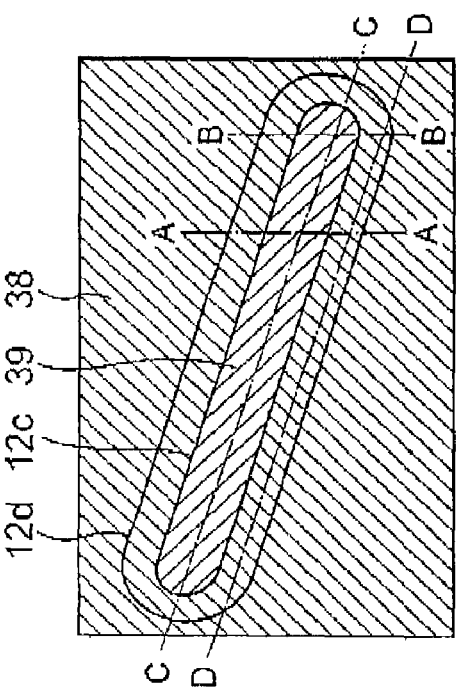
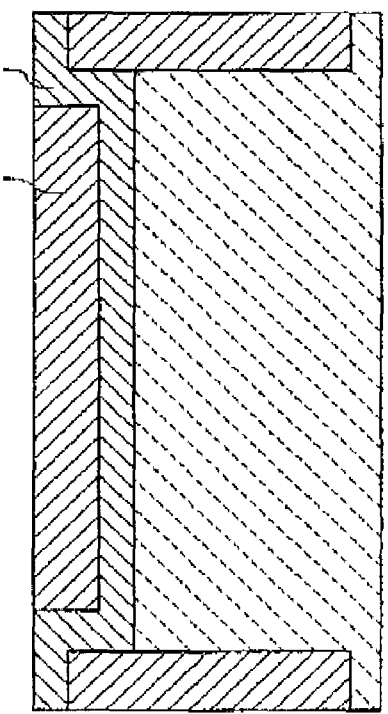

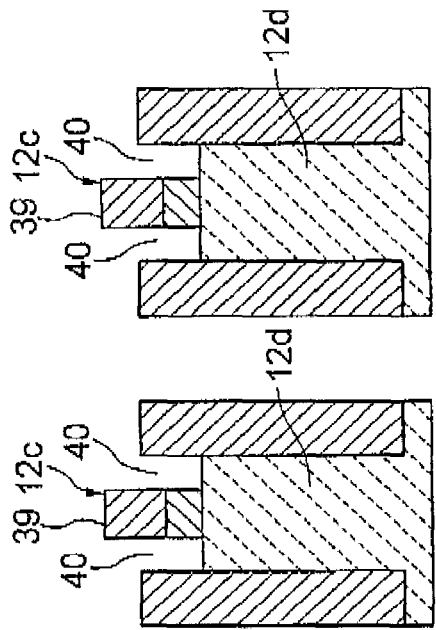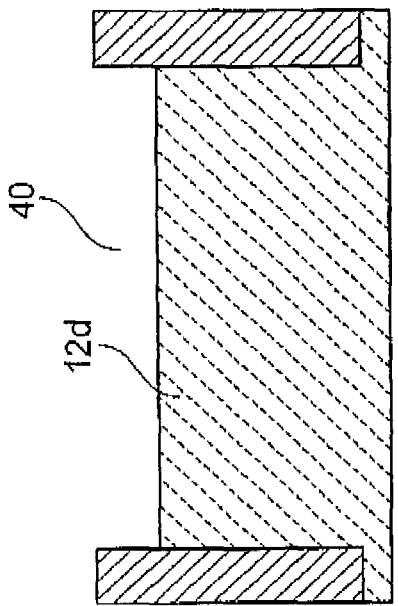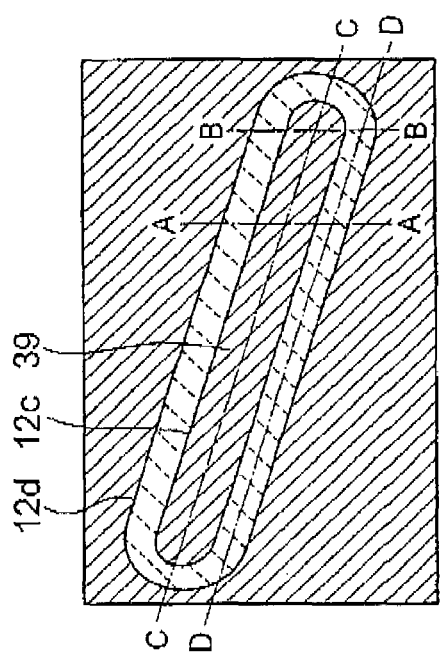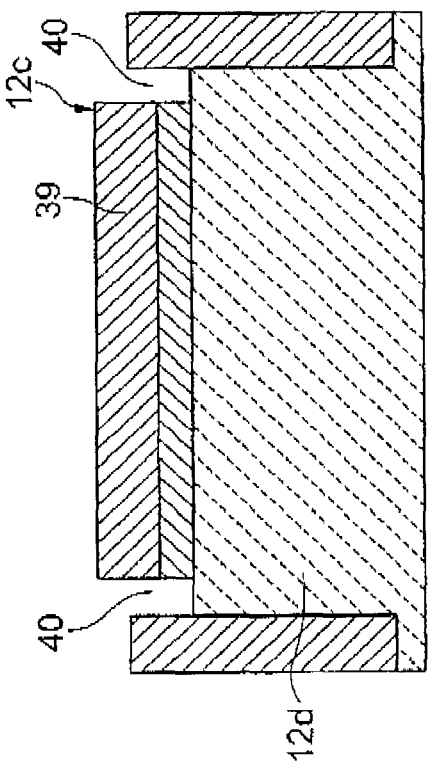

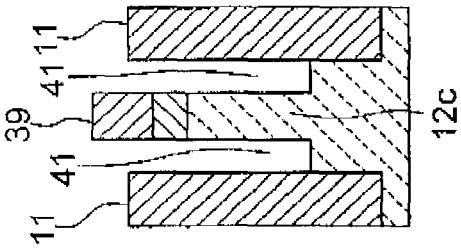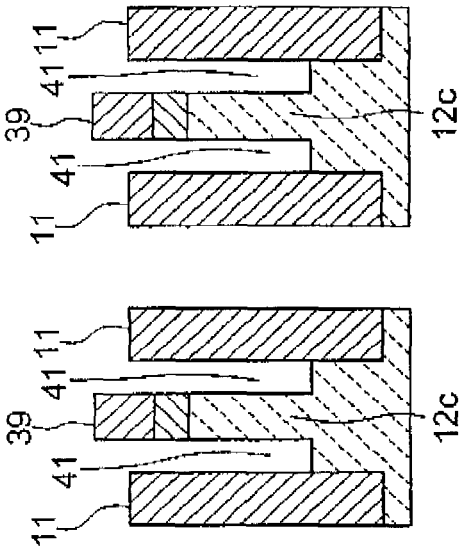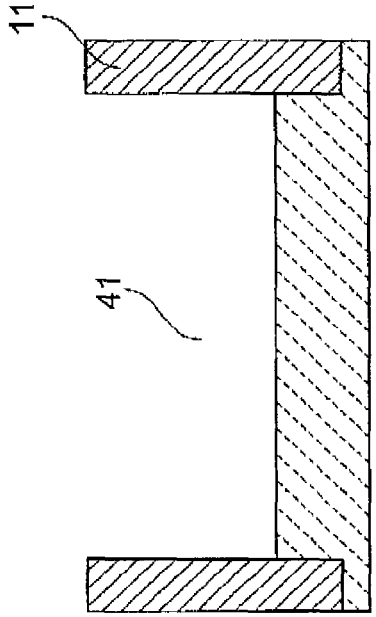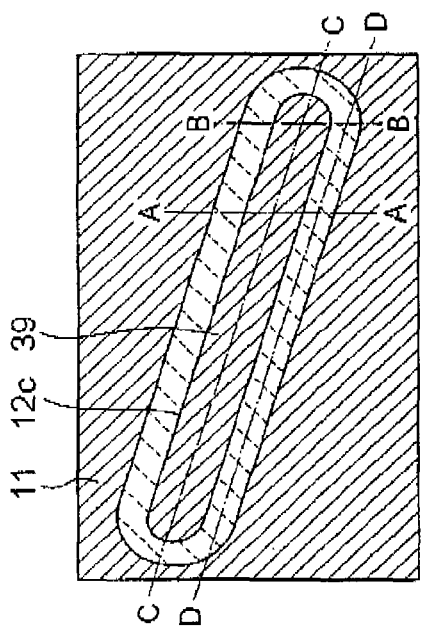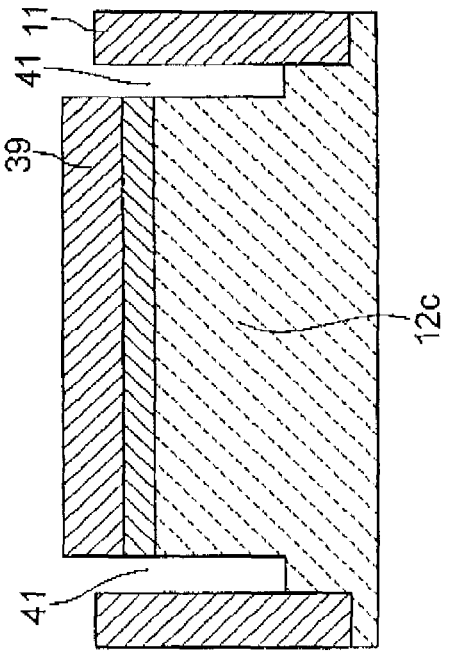

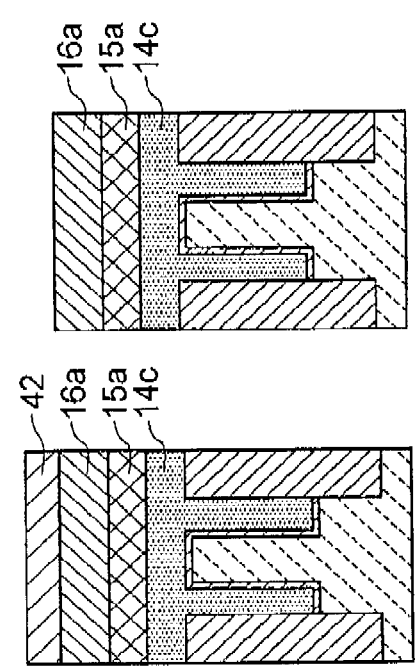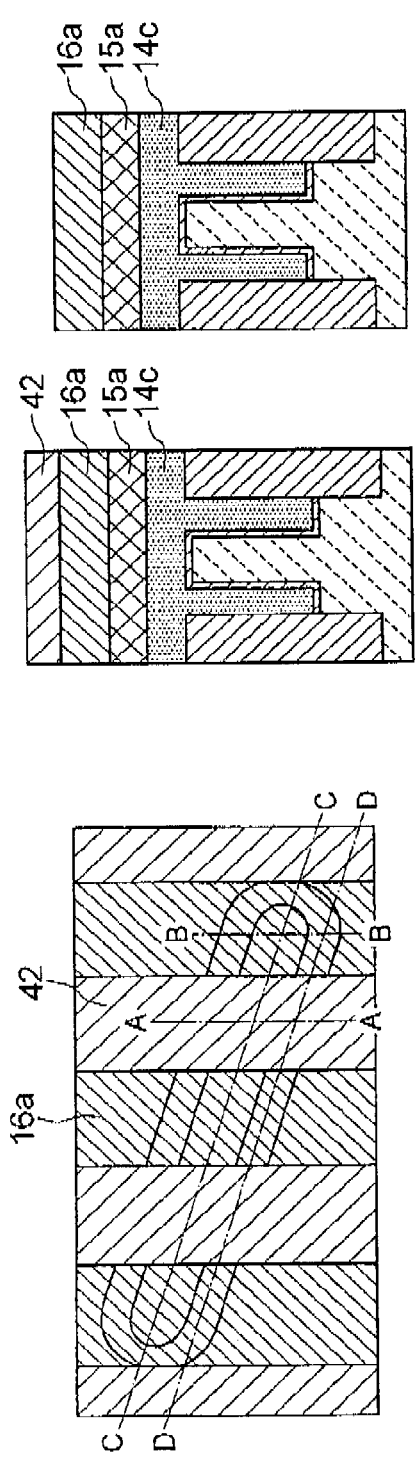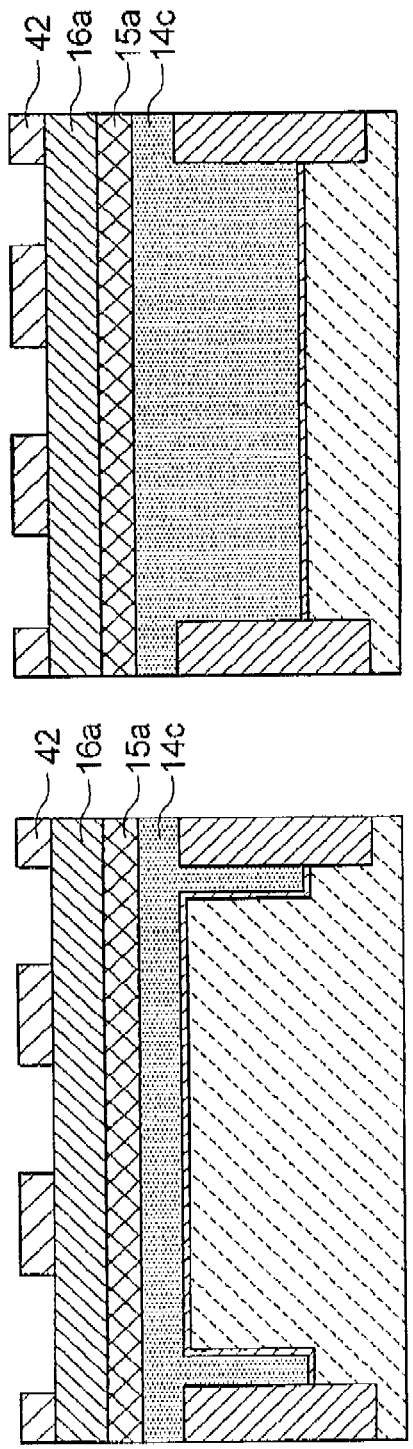

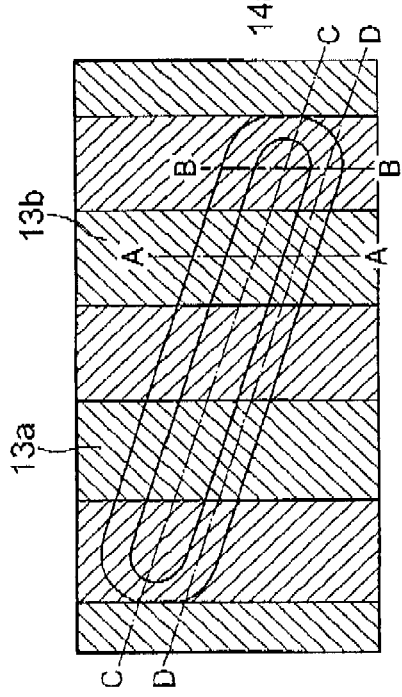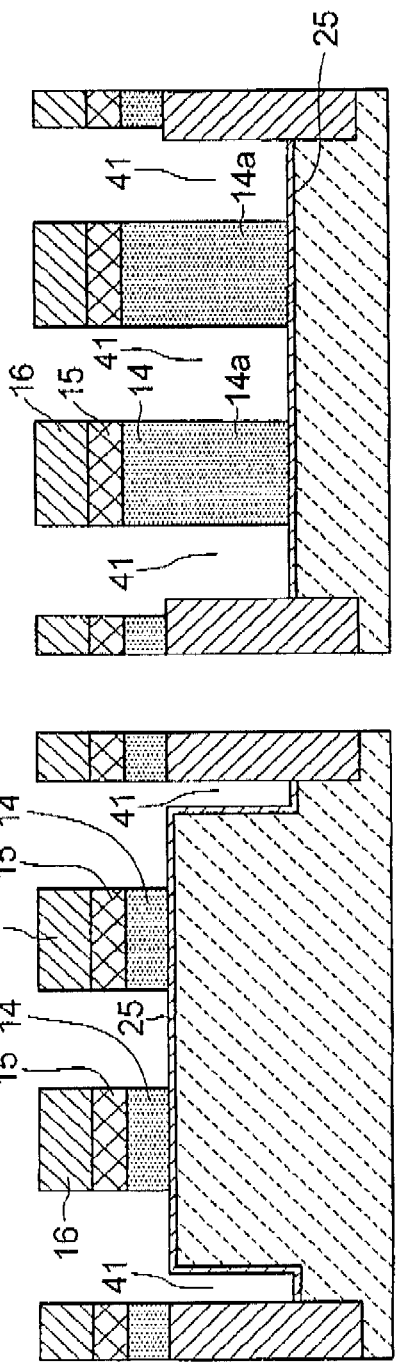

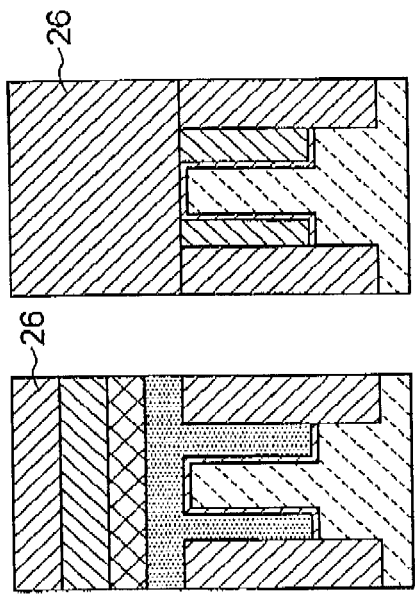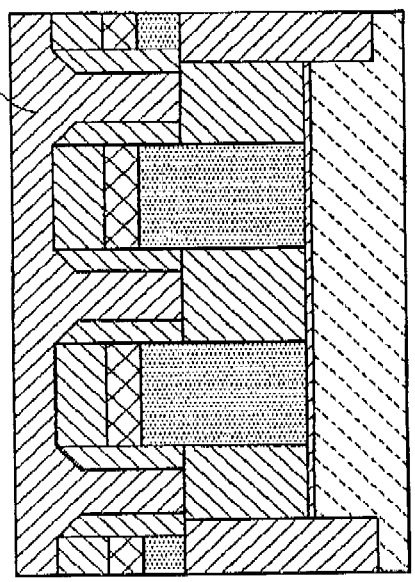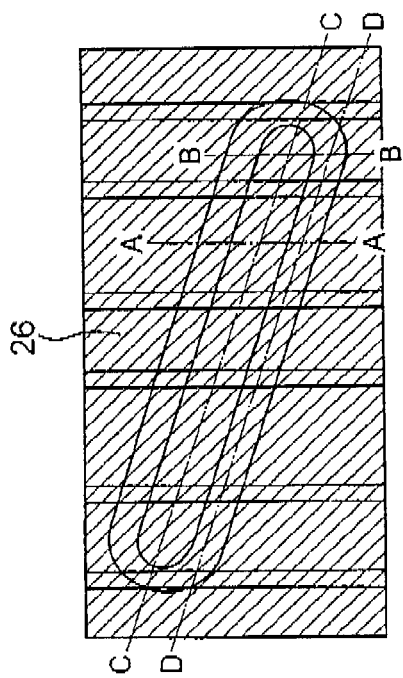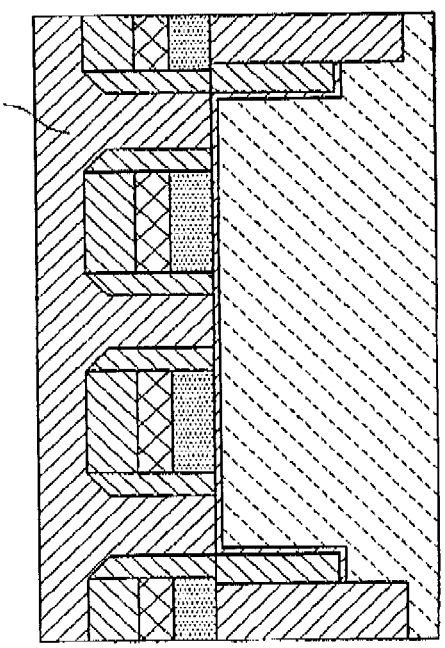
FIG. 13
FIG. 13A
FIG. 13B
FIG. 13C
FIG. 13D

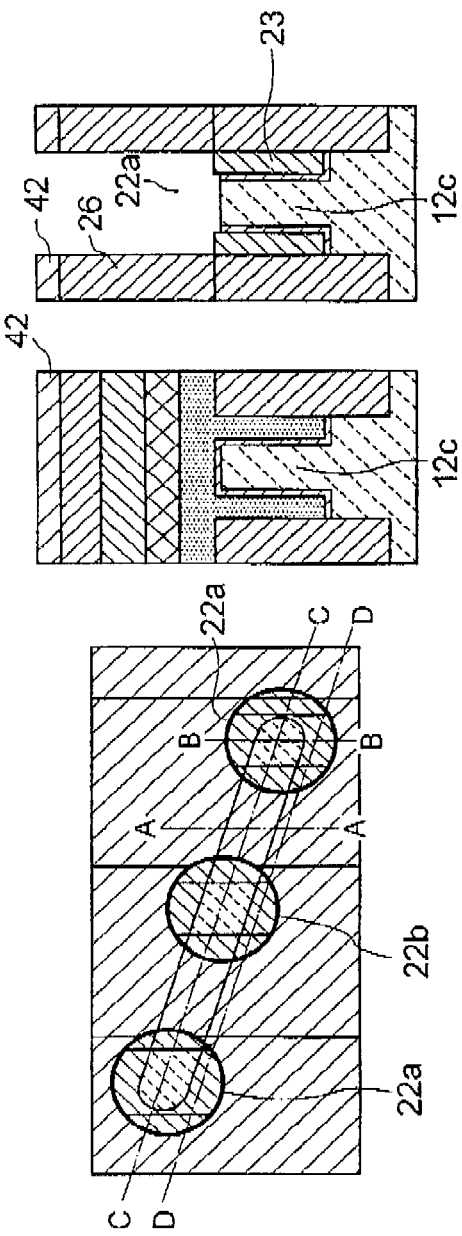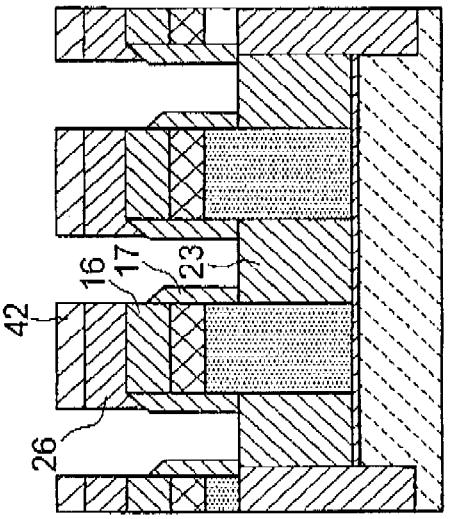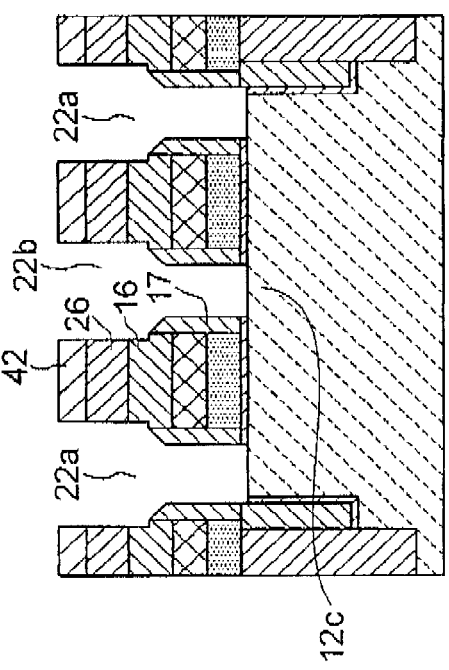

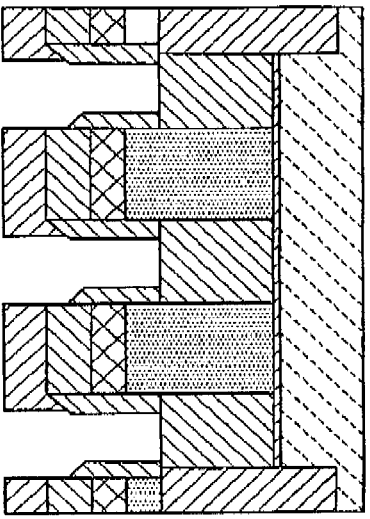
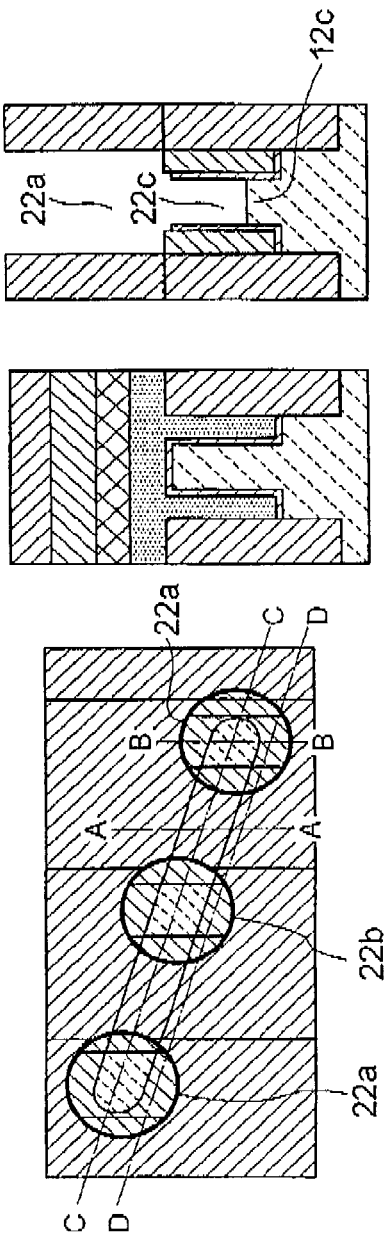
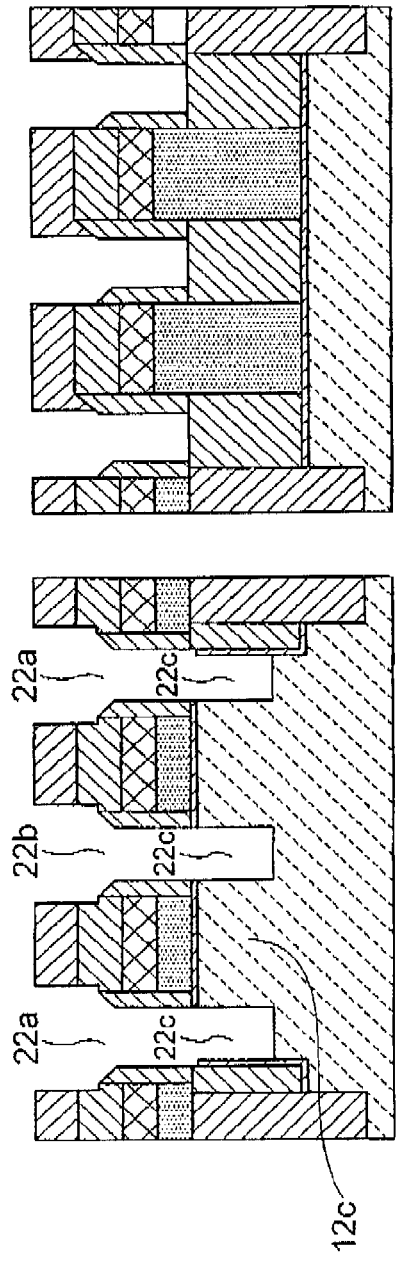

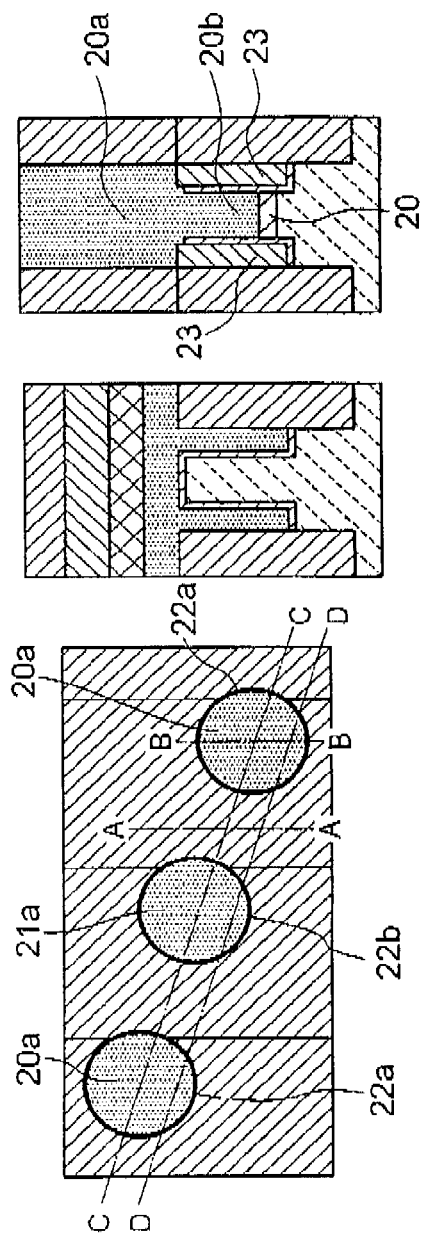

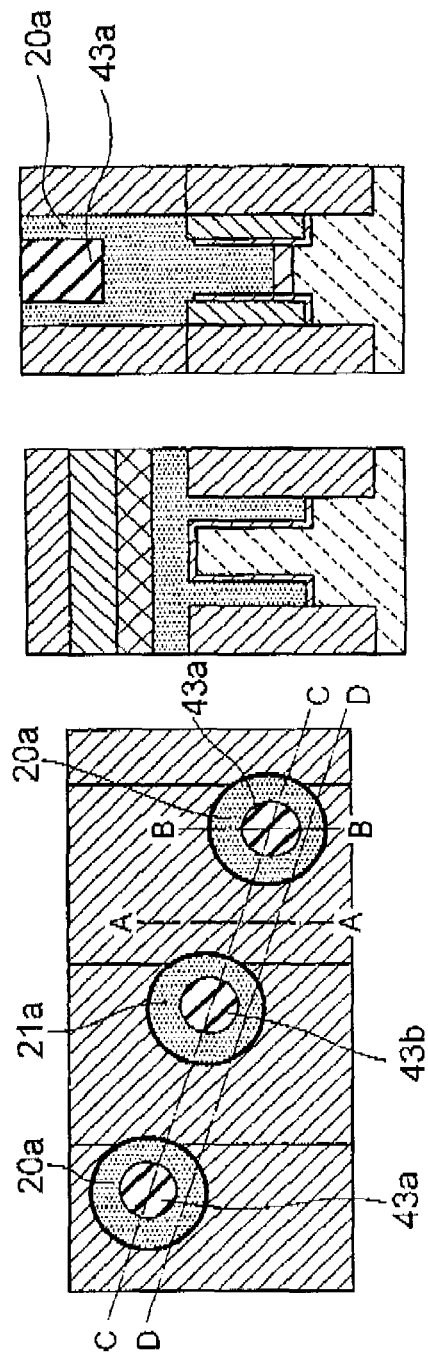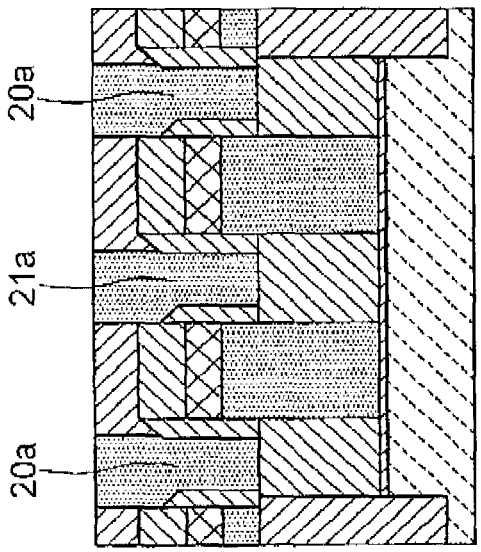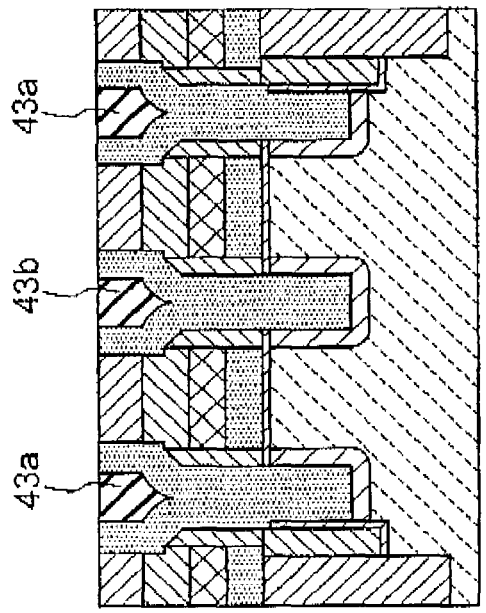

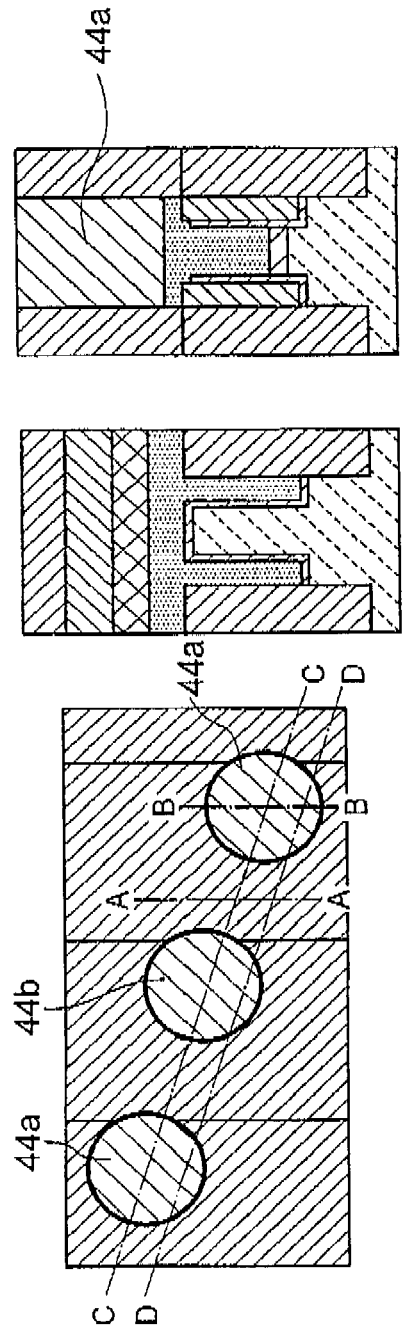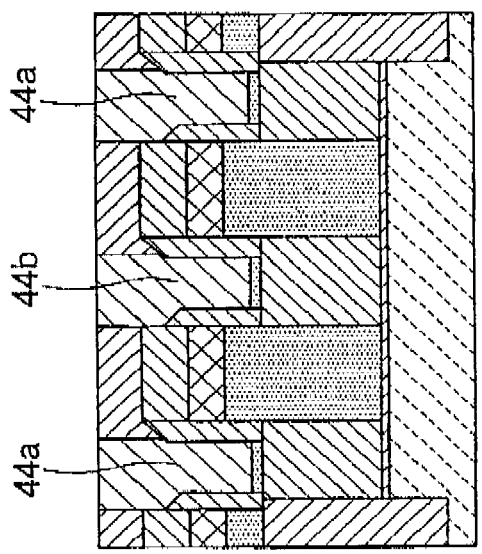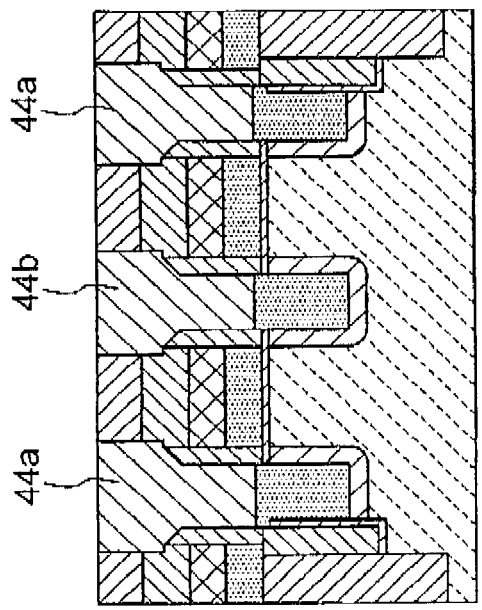

SEMICONDUCTOR DEVICE INCLUDING AN EMBEDDED CONTACT PLUG

FIELD OF THE INVENTION

The present invention relates to a semiconductor device, a method for manufacturing a semiconductor device, a DRAM (dynamic random access memory) device and a data processing system, and more particularly, to the structure of a transistor in a semiconductor device, and method for forming the transistor, as well as a data processing system that includes a DRAM device.

BACKGROUND OF THE INVENTION

Improvement of the integration density of a semiconductor device has been achieved mainly by developing finer patterning of transistors therein. However, in a typical transistor of a planar type, the development of finer patterning inevitably reduces the gate length. This reduction of the gate length increases the sub-threshold current of the transistor due to a short channel effect. For prevention of the short channel effect, it is necessary to employ a countermeasure as by increasing the impurity concentration of the channel region of the transistor.

However, a higher impurity concentration of the channel region incurs the problem of increase of a junction leakage current. Although the junction leakage current scarcely causes a significant problem in a transistor used in a logic circuit, the junction leakage current incurs a serious problem in a transistor of a DRAM memory cell, considerably degrading the refresh characteristic thereof. Thus, as a method of preventing the short channel effect, it is not appropriate to increase the impurity concentration of the channel region, especially in a cell transistor of the DRAM device.

Techniques for preventing the short channel effect without increasing the impurity concentration of the channel region include one that forms a transistor in a three-dimensional structure, i.e. not in a two-dimensional structure, unlike the planar transistor.

A fin-type transistor (fin transistor) is known as one of the three-dimensional transistors. The fin transistor includes a semiconductor active area having a shape of fin extending perpendicularly to the surface of the semiconductor substrate on which the transistor is formed. The top and side surfaces of the fin are covered by the gate electrode of the transistor, whereby the effective channel width of the transistor is increased to secure a sufficient ON current therein. In addition, the configuration wherein the gate electrode covers the top and side surfaces of the fin provides a superior controllability by the gate electrode, which effectively suppresses occurrence of the short channel effect. Further, it is possible to reduce the channel width as viewed perpendicular to the substrate surface, while securing a sufficient ON current, without occurring of an insufficient depletion of the channel region during the OFF state thereof. This provides improvement in the sub-threshold current characteristic as well as reduction of the off-leakage current.

The fin transistor is described in the following patent publications:

JP-1993-218415A (Patent Publication 1);
JP-2002-118255A (Patent Publication 2); and
JP-2005-150742A (Patent Publication 3).

The present inventor conceived the problem of increased gate capacitance encountered with the fin transistor, as will be described hereinafter. The gate capacitance in the fin transistor may be reduced by forming an isolation area to encircle the fin active area of the transistor and forming a substantially planarized surface on which the gate electrode is formed, such as described in Patent Publication 2 (FIGS. 20 and 68) and Patent Publication 3, without forming the three-dimensional gate electrode. However, this structure incurs the problem of poor controllability of the source/drain diffused regions formed adjacent to the gate electrode. This problem will be described with reference to drawings.

FIG. 20A is a perspective view of a fin transistor, and FIGS. 20B and 20C are sectional views thereof taken along lines X-X and Y-Y in FIG. 20A. In FIG. 20A, a fin active area 12 is encircled by an isolation area 11 on a semiconductor (silicon) substrate 10. A gate electrode 13 extends across the active area 12, and includes a first portion opposing the top surface 12a of the active area 12, and a pair of second portions 14a and 14b each opposing the sidewall of the active area 12. A portion of the active area 12 encircled by the first and second portions of the gate electrode 13 configures a channel or channel region 12b of the transistor. Drain 20 and source 21 are formed in the active area adjacent to both ends of the channel region 12b.

In FIG. 20B, slits 18 and 19 are provided adjacent to the isolation area 11. The slits 18 and 19 are filled with a polysilicon film 14 which configures the second portion of the gate electrode, or sidewall electrodes 14a, 14b. The fin channel region 12b encircled by the gate electrode 13 in three directions includes a top surface 12a, and side surfaces 18a, 19a. The gate electrode 13 has a two-layer structure including a polysilicon film 14 and a metallic film 15 formed thereon. A top insulation film 16 is formed on the metallic film 15. Since the most portion of the gate electrode 13 is located on the top surface of the isolation area 11 which includes therein a thick insulating film, the gate capacitance can be reduced in this structure.

In FIG. 20C, the gate electrode 13 including the polysilicon film 14 and metallic film 15 and the top insulation film 16 are formed on the active area 12 with an intervention of a gate insulation film (not illustrated). A sidewall insulation film 17 is also formed on the sidewall of the gate electrode 13. The drain 20 and source 21 are formed by ion implantation into the surface portion of the active area 12 by using the top insulation film 16 and sidewall insulation film 17 as a mask. After introduction of impurities into the source/drain regions, a heat treatment is generally conducted to diffuse the impurities. If the impurities are diffused to a depth larger than the depth denoted by "H" in FIG. 20B, the impurities existing below the gate electrode 13 reduce the effective channel length, which is denoted by L1 in FIG. 20C, and changes the designed threshold voltage, whereby a desired transistor characteristic cannot be obtained.

Patent Publication 1 describes a structure wherein the active area is not surrounded by the isolation area, and thus ion-implantation for the source/drain regions is performed also into an exposed side surface of the active area by a slanted implantation. However, as shown in FIG. 3 of the Patent Publication 1, depth of the diffused regions thus implanted is restricted by the location of the side surface of the adjacent active area, i.e., restricted by the width of the slit. A smaller width of the slit is incompatible with a larger depth of the diffused regions, thereby restricting the degree of finer patterning. In addition, it is not practical to form the structure of gate electrode being matched with the step difference formed in the active area, because the step difference may incur a significant amount of residuals after etching for the gate electrode.

SUMMARY OF THE INVENTION

It is an object of the present invention to provide a semiconductor device including a transistor which is capable of suppressing occurrence of the short channel effect and includes source drain regions having a desired depth.

It is another object of the present invention to provide a method for manufacturing such a semiconductor device, a DRAM device configured by such a semiconductor device, and a data processing system including the DRAM device.

The present invention provides a semiconductor device including: a semiconductor substrate including an active area isolated by an isolation area; a gate electrode extending across the active area; and source and drain regions disposed in the active area in association with the gate electrode, wherein: each of the source and drain regions includes an impurity-containing conductive plug embedded therein.

The present invention also provides a method for manufacturing a semiconductor device including the steps of: forming an active area isolated by an isolation area in a surface region of a semiconductor substrate; forming a gate electrode extending across the active area; embedding a pair of impurity-containing conductive plugs in the active area in a vicinity of both sides of the gate electrode; and diffusing impurities from the impurity-containing conductive plugs toward the active area, to form source and drain regions associated with the gate electrode.

The present invention further provides a method for manufacturing a semiconductor device including the steps of: forming a plurality of pseudo active areas arranged at a specific interval in a surface region of a semiconductor substrate and isolated from one another by an isolation area; forming a slit in a portion of each of the pseudo active areas adjacent to the isolation area, to form an active area from the each of the pseudo active area excepting the slit: depositing a conductive material to form a first gate electrode portion extending across the active area, and configure a portion of the slit underlying the first gate electrode portion as a second gate electrode portion; depositing an insulation material to form a sidewall insulation film on a sidewall of the first gate electrode portion and embed the insulation film into the pair of slits; forming an interlevel dielectric film covering the first gate electrode portion and including therein a pair of contact holes exposing therethrough a surface portion of the active area in a vicinity of both sides of the first gate electrode portion; etching the active area to extend the contact holes within the active area; embedding an impurity-containing contact plug in each of the contact holes; and diffusing impurities from the impurity-containing conductive plug toward the active area, to form a source/drain diffused region associated with the gate electrode.

The present invention further provides a DRAM device including the semiconductor device of the present invention.

The present invention further provides a data processing system including the DRAM device of the present invention.

In accordance with the semiconductor device of the present invention, the source and drain regions have a larger depth due to the impurity-containing conductive plug embedded in the semiconductor substrate, without an increased width of the source and drain regions because the diffused regions are formed by diffusion of impurities from the impurity-containing conductive plug, i.e., not by an ion-implantation step.

The above and other objects, features and advantages of the present invention will be more apparent from the following description, referring to the accompanying drawings.

BRIEF DESCRIPTION OF THE DRAWINGS

FIG. 3 is a top plan view of the semiconductor device of FIG. 1 during a step of a fabrication process thereof.

FIGS. 3A to 3D are sectional views during the step of FIG. 3, corresponding to the structure taken along lines A-A to D-D, respectively, in FIG. 3.

FIG. 4 is a top plan view of the semiconductor device of FIG. 1 during a step subsequent to the step of FIG. 3.

FIGS. 4A to 4D are sectional views during the step of FIG. 4, corresponding to the structure taken along lines A-A to D-D, respectively, in FIG. 4.

FIG. 5 is a top plan view of the semiconductor device of FIG. 1 during a step subsequent to the step of FIG. 4.

FIGS. 5A to 5D are sectional views during the step of FIG. 5, corresponding to the structure taken along lines A-A to D-D, respectively, in FIG. 5.

FIG. 6 is a top plan view of the semiconductor device of FIG. 1 during a step subsequent to the step of FIG. 5.

FIGS. 6A to 6D are sectional views during the step of FIG. 6, corresponding to the structure taken along lines A-A to D-D, respectively, in FIG. 6.

FIG. 7 is a top plan view of the semiconductor device of FIG. 1 during a step subsequent to the step of FIG. 6.

FIGS. 7A to 7D are sectional views during the step of FIG. 7, corresponding to the structure taken along lines A-A to D-D, respectively, in FIG. 7.

FIG. 8 is a top plan view of the semiconductor device of FIG. 1 during a step subsequent to the step of FIG. 7.

FIGS. 8A to 8D are sectional views during the step of FIG. 8, corresponding to the structure taken along lines A-A to D-D, respectively, in FIG. 8.

FIG. 10 is a top plan view of the semiconductor device of FIG. 1 during a step subsequent to the step of FIG. 9.

FIGS. 10A to 10D are sectional views during the step of FIG. 10, corresponding to the structure taken along lines A-A to D-D, respectively, in FIG. 10.

FIG. 11 is a top plan view of the semiconductor device of FIG. 1 during a step subsequent to the step of FIG. 10.

FIGS. 11A to 11D are sectional views during the step of FIG. 11, corresponding to the structure taken along lines A-A to D-D, respectively, in FIG. 11.

FIGS. 12A to 12D are sectional views during the step of FIG. 12, corresponding to the structure taken along lines A-A to D-D, respectively, in FIG. 12.

FIG. 13 is a top plan view of the semiconductor device of FIG. 1 during a step subsequent to the step of FIG. 12.

FIGS. 13A to 13D are sectional views during the step of FIG. 13, corresponding to the structure taken along lines A-A to D-D, respectively, in FIG. 13.

FIG. 14 is a top plan view of the semiconductor device of FIG. 1 during a step subsequent to the step of FIG. 13.

FIGS. 14A to 14D are sectional views during the step of FIG. 14, corresponding to the structure taken along lines A-A to D-D, respectively, in FIG. 14.

FIG. 15 is a top plan view of the semiconductor device of FIG. 1 during a step subsequent to the step of FIG. 14.

FIGS. 15A to 15D are sectional views during the step of FIG. 15, corresponding to the structure taken along lines A-A to D-D, respectively, in FIG. 15.

FIG. 16 is a top plan view of the semiconductor device of FIG. 1 during a step subsequent to the step of FIG. 15.

FIGS. 16A to 16D are sectional views during the step of FIG. 16, corresponding to the structure taken along lines A-A to D-D, respectively, in FIG. 16.

FIG. 17 is a top plan view of a semiconductor device modified from the first embodiment, showing the vicinity of contact plugs therein.

FIGS. 17A to 17D are sectional views of the semiconductor device of FIG. 17, taken along lines A-A to D-D, respectively, in FIG. 17.

FIG. 18 is a top plan view of another semiconductor modified from the first embodiment, showing the vicinity of contact plugs therein.

FIGS. 18A to 18D are sectional views of the semiconductor device of FIG. 18, taken along lines A-A to D-D, respectively, in FIG. 18.

DESCRIPTION OF EMBODIMENTS OF THE INVENTION

Figure 1:
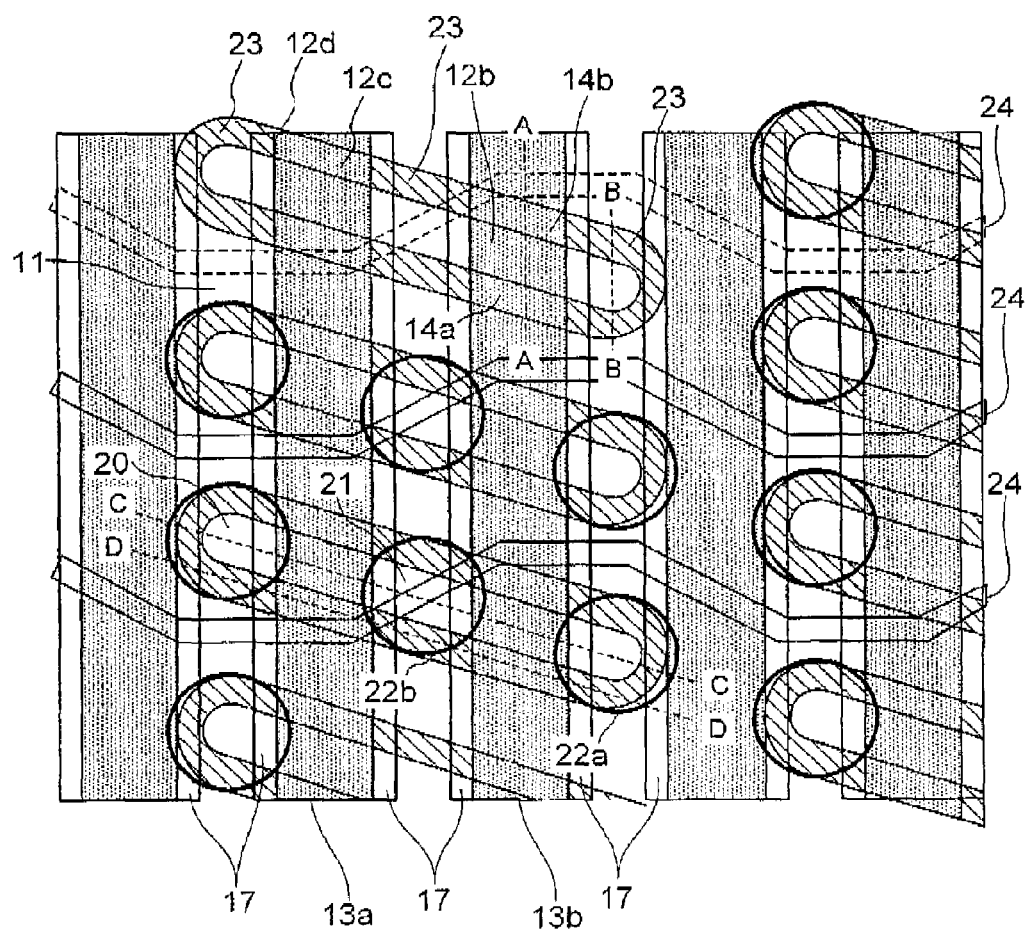
FIG. 1 is a schematic top plan view of a semiconductor device according to a first embodiment of the present invention.

Hereinafter, exemplary embodiments of the present invention will be described with reference to accompanying drawings. FIG. 1 is a is schematic top plan view of a DRAM device configured by a semiconductor device according to a first embodiment of the present invention. The top plan view of FIG. 1 shows underlying patterns not exposed from an overlying pattern, in order for illustrating the locational relationship between different patterns in the DRAM device. In this description, it is assumed for the sake of convenience that the source/drain regions of a MOS transistor are fixed for the role thereof, although the source and drain regions of the MOS transistor acting at a specific stage may act conversely as drain and source regions, respectively, at another stage.

In FIG. 1, the DRAM device includes an array of memory cells formed in the active areas, gate electrodes 13 (13a, 13b) used as word lines extending in a row direction of the array, and a plurality of bit lines extending in a column direction of the array. For one active area 12c noticed here, a pseudo active area 12d surrounding the active area 12c is isolated by an isolation area 11 from other pseudo active areas 12, and a slit is provided between the active area 12c and the corresponding pseudo active area 12d. The slit and active area 12 have a longer side extending parallel to lines C-C and D-D in a first direction (column direction), and the gate electrodes 13 extend parallel to lines A-A and B-B in a second direction (row direction) intersecting the first direction. The gate electrodes 13 have a first electrode portion extending in the second direction, and a pair of second electrode portions extending from the first electrode portion to the slits for each MOS transistor. The second electrode portions 14 (14a, 14b) may be referred to as sidewall electrode.

The slit encircling the active area 12 includes first slit portions underlying the respective first electrode portions of the gate electrode 13 and filled with the sidewall electrodes 14a, 14b of the gate electrode 13, which oppose each other in the direction of line A-A. A portion of the active area 12 sandwiched between the sidewall electrodes 14a, 14b configures a fin channel. The slit also includes second slit portions filled with an insulation film 23 and sandwiched between two sidewall electrodes 14 along the extending direction of the slit. The insulation film is made of the material configuring the isolation area 11.

Two gate electrodes 13a and 13b overlie and cross a single active area 12 in this embodiment. This is the structure wherein the present invention is applied to memory cell transistors in a DRAM device, although the present invention is not limited to this structure. That is, a single gate electrode or three or more gate electrodes may overlie a single active area in the present invention. Memory cell contact holes 22a, 22b are formed at the center and a vicinity of both ends of the active area 12 as viewed in the longitudinal direction thereof. The source/drain diffused regions 20, 21 are provided in the vicinity of the memory cell contact holes 22a, 22b. The source diffused region 20 is connected to a capacitor, whereas the drain diffused region 21 is connected to a bit line 24.

In the present embodiment, the slit includes first slit portions filled with the gate electrode material, and second slit portions filled with the insulation film, as described above. This structure provides a configuration wherein the sidewall electrodes 14a, 14b of the gate electrode 13 do not oppose the source/drain diffused regions, thereby reducing the parasitic capacitance between the gate electrode 13 and the source/drain diffused regions and providing a higher-seed operation to the DRAM device. In addition, the structure alleviates the electric field intensity and thus reduces a GIDL (gate-induced drain leakage current) between the source region and the drain region. The slit encircling the whole of the pseudo active area 12d solves the problem of misalignment between the gate electrode and the slit, which may occur if the slit is to be formed in a limited area.

Figure 2:
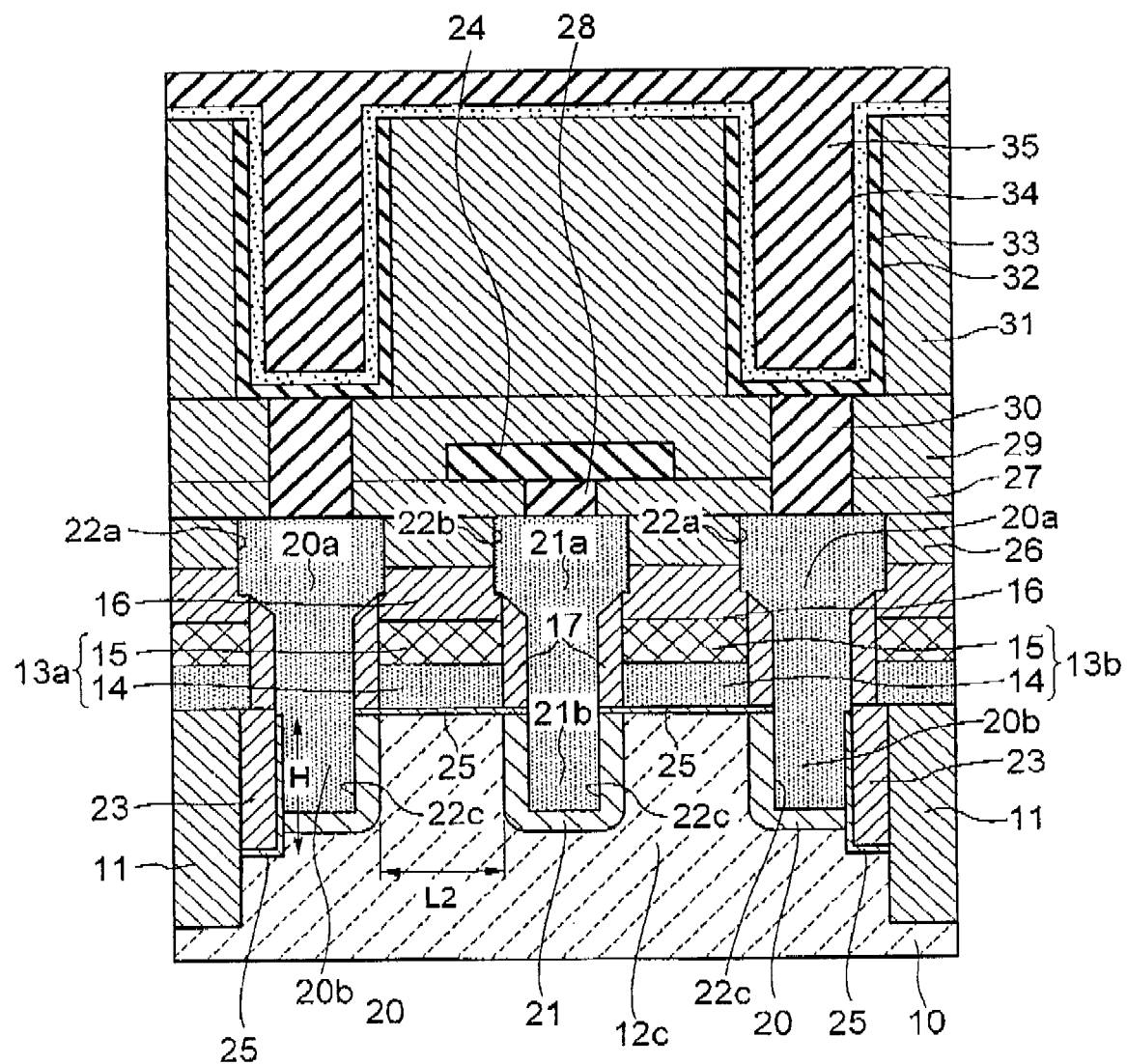
FIG. 2 is a schematic sectional view of the semiconductor device of FIG. 1.
Figure 9:
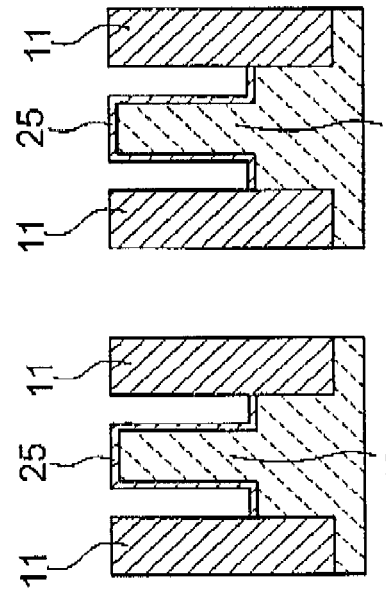
FIG. 9 is a top plan view of the semiconductor device of FIG. 1 during a step subsequent to the step of FIG. 8.
Figures 9A, 9B:
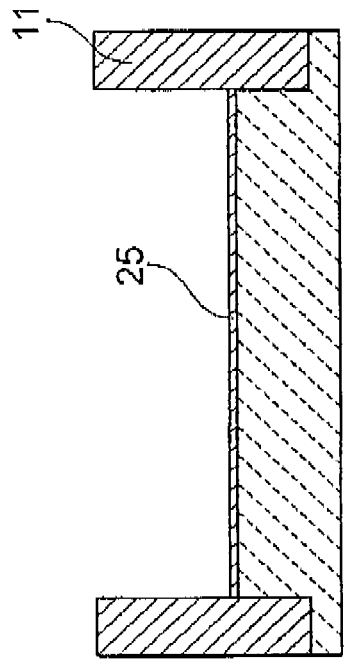
FIGS. 9A to 9D are sectional views during the step of FIG. 49 corresponding to the structure taken along lines A-A to D-D, respectively, in FIG. 9.
Figure 9C:
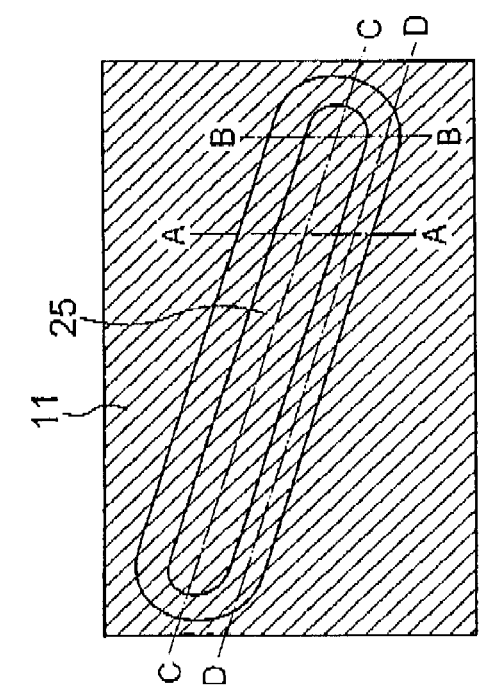
Figure 9D:
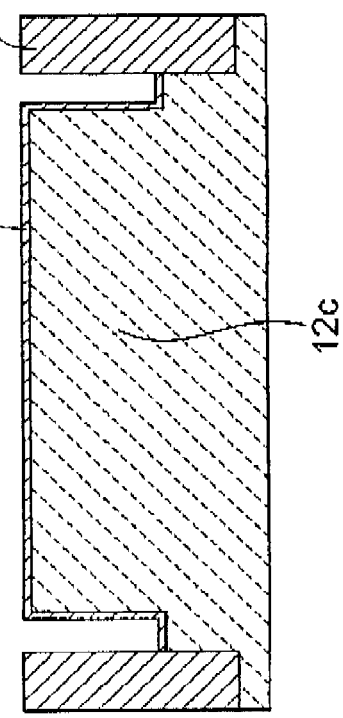
Figure 12:
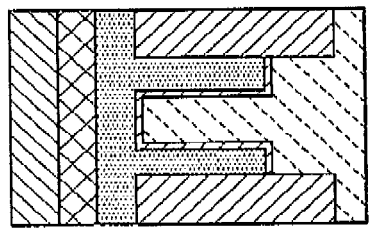
FIG. 12 is a top plan view of the semiconductor device of FIG. 1 during a step subsequent to the step of FIG. 11.
Figure 12B:
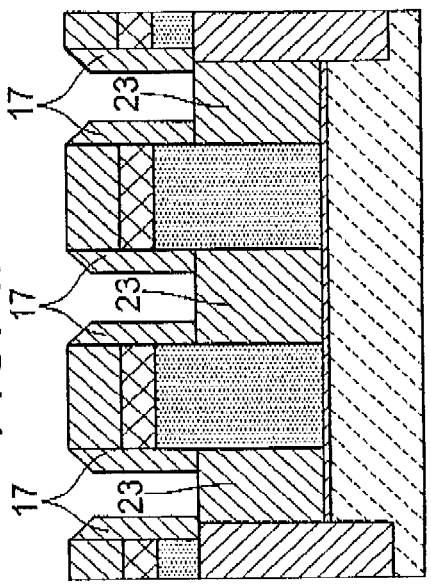
Figure 12C:
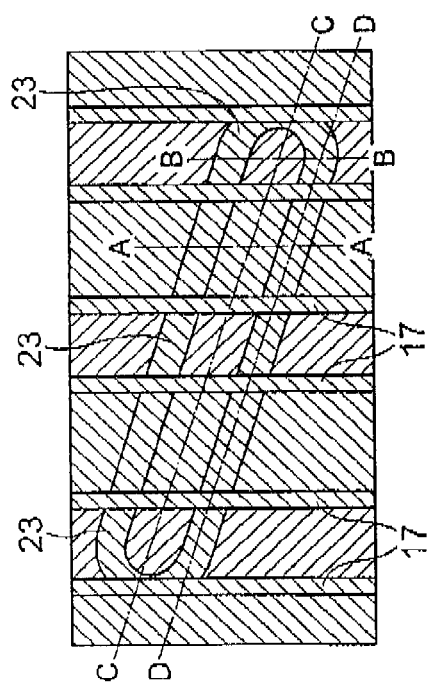
Figure 12D:
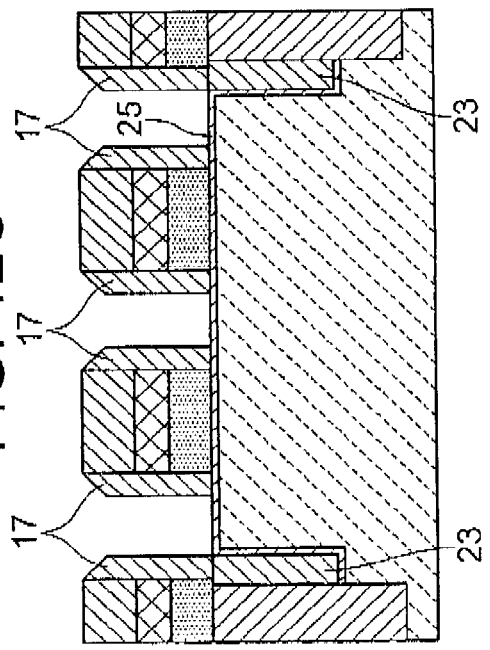

FIG. 2 is a sectional view taken alone line C-C in FIG. 1. The isolation area 11 isolating the active areas 12c from one another is formed in the silicon substrate 10. Between the active area 12c and the isolation area 11, there is provided a slit filled with the insulation film 23. The gate electrode 13a, 13b includes a first conductive material 14 and a second conductive material 15, which are formed on the surface of the active area 12c with an intervention of the gate insulation film 25. A top insulation film 16 is formed on the gate electrode 13, and a sidewall insulation film 17 is formed on the sidewall of the gate electrode 13. An interlayer dielectric film 26 is formed on the top insulation film 16, and memory cell contact holes 22a, 22b are provided therein at the location between adjacent gate electrodes 13.

Plug contact holes 22c are formed within the silicon substrate to extend from the bottom of the memory contact holes 22a, 22b. A conductive material is embedded within the memory contact holes 22a, 22b and bottom contact holes 22c, to configure therein memory-cell contact plugs 20a, 21a including the embedded (buried) contact plugs 20b, 21b.

The source diffused region 20 and drain diffused region 21 encircle the embedded contact plugs 20b, 21b. The bottom surface of the source/drain diffused region 20, 21 has a depth not larger than the depth "H" of the slit. Another interlevel dielectric film 27 is formed on the interlayer dielectric film 26 and memory-cell contact plugs 20a and 21a, and the bit line contact plugs 28 and bit lines 24 are formed on the memory-cell contact plugs 21a. Another interlayer dielectric film 29 is formed on the bit lines 24, and capacitor contact plugs 30 are formed on the memory-cell contact plugs 20a. A thick insulation film 31 having therein cylindrical holes is formed thereon, and capacitors are formed in the cylindrical holes 32, the capacitors including a bottom electrode 33, capacitor insulation film 34, and a top electrode 35. Although not illustrated in FIG. 2, other interconnections are formed on the thick insulation film 31, to configure the basic structure of a DRAM cell array.

In the present embodiment, as shown in FIG. 2, the source/drain diffused regions 20, 21 are formed on the circumference of embedded contact plugs 20b, 21b formed within the active area 12c of the silicon substrate. Since the embedded contact plugs 20b, 21b have a columnar surface extending perpendicularly to the surface of the active area 12c, the source/drain diffused regions 20, 21 also have a columnar surface extending perpendicular to the top surface of the active area 12c. Since the surface of the embedded contact plugs 20b, 21b opposing the fin channel 12b is defined by the sidewall insulation film 17 as shown in FIG. 1, the end surface of the source/drain diffused regions 20, 21 is parallel to the direction of the second direction in which the gate electrode 13 extends, whereby the embedded contact plugs 22c have a substantially square or rectangular shape in cross section thereof. Accordingly, the length L2 of the channel region 12b is constant as viewed in the depth-wise direction, whereby the source/drain diffused regions 20, 21 do not protrude into the channel region 12b and thus do not fluctuate the transistor characteristics.

A method for manufacturing the semiconductor device of the present embodiment will be described hereinafter with reference to FIGS. 3 to 16, and FIGS. 3A to 3D, 4A to 4D, ..., and 16A to 16D. FIGS. 3 to 16 are top plan views of an active area shown in FIG. 1, consecutively showing steps of the process for manufacturing the semiconductor device. Sectional views of the step of FIGS. 3 to 16 are shown by the same drawing number attached with corresponding alphabets, which are same as the alphabets denoting lines A-A to D-D in FIGS. 1 to 16.

A pad oxide film is first formed on the silicon substrate 10, followed by forming a silicon nitride film 36 having a thickness of about 150 nm by a CVD (chemical vapor deposition) technique, as shown in FIGS. 3 and 3A to 3D. Subsequently, using a well-known photolithographic technique, the silicon nitride film 36 is patterned to configure a hard mask for forming the pseudo active area 12d. Dry etching of the silicon substrate 10 is performed using the silicon nitride film 36 as an etching mask, to thereby form an isolation trench 37 having a depth of about 200 nm and pseudo active areas 12 isolated from one another by the isolation trench 37. In this step, the hard mask is 350 nm long in the direction of C-C and 70 nm wide in the direction perpendicular thereto. This size of the hard mask corresponds to a Giga-bit class DRAM device, which is expressed by "F70" as a minimum pattern size. In this stage, the silicon nitride film 36 is also etched by a thickness of around 50 nm.

Thereafter, as shown in FIGS. 4 and 4A to 4D, a silicon oxide film having a thickness of about 400 nm is deposited on the entire surface including the internal of trench 37 by using a HDP (high density plasma)-CVD technique. Subsequently, the silicon oxide film is polished by a CMP (chemical-mechanical polishing) process using the silicon nitride film 36 as a stopper, to thereby form the isolation area 11 in the trench 37.

Thereafter, as shown in FIGS. 5, and 5A to 5D, a wet etching process is performed using phosphoric acid ($H_3PO_4$) heated up to a temperature of about 160° C. as an etchant to remove the silicon nitride film 36, followed by removing the pad oxide film by using a hydrofluoric(HF)-acid-containing liquid. This step provides a structure wherein the isolation area 11 protrudes from the top surface of the pseudo active area 12d to form a step difference between the isolation area 11 and the pseudo active area 12d. It is preferable that the step difference be around 100 nm or smaller.

Thereafter, as shown in FIGS. 6 and 6A to 6D, a 20-nm-thick silicon nitride film 38 is formed on the entire surface. Subsequently, a 50-nm-thick silicon oxide film 39 is formed, followed by polishing thereof using a CMP technique and the silicon nitride film 38 as a stopper. With reference to FIGS. 6A and 6B, a 30-nm-wide trench is formed in the central portion of the active area at the stage after the 20-nm-thick silicon nitride film is formed in the 70-nm-wide pseudo active area 12d. The 30-nm-wide trench is entirely filled with silicon oxide after the deposition of 50-nm-thick silicon oxide film 39. As will be understood from FIG. 6, the sidewall of the trench filled with the silicon oxide film 39 defines the active area 12c. It is preferable to set the thickness of the silicon nitride film 38 to be equal to or below half the width of the pseudo active area 12d, and thus the width is set at about 10-25 nm, for example.

Thereafter, as shown in FIGS. 7 and 7A to 7D, the silicon nitride film 38 is subjected to an etch-back process using a dry etching, to form openings 40 between the outer periphery of the pseudo active area 12d and the outer periphery of the active area 12c. The width of openings 40 is determined by the thickness of silicon nitride film 38. Thereby, the surface of pseudo active area 12d is exposed from bottom of the openings 40. The surface of isolation area 11 is also exposed.

Subsequently, as shown in FIGS. 8 and 8A to 8D, using the silicon oxide film 39 and silicon oxide film of the isolation area 11 as a mask, a selective dry etching is performed to the silicon substrate in the pseudo active area 12d exposed through the openings 40, to thereby form slits 41. The depth of the slits 41 is 100 nm. The depth of the slits 41 may be changed depending of the transistor characteristic desired. The formation of the slits 41 forms a fin active channel 12c between opposing slits 41.

Thereafter, as shown in FIGS. 9 and 9A to 9D, the gate insulation film 25 is formed. In this step, etch-back of the silicon oxide film 39 is performed by a dry etching technique, followed by removing the silicon nitride film by a wet etching process using heated phosphoric acid. The dry etching uses octafluorocyclobutane ($C_4F_8$) and octafluorocyclopentane ($C_5F_8$) as an etching gas. These etching gases may maintain the ratio of etching rate of silicon to silicon oxide film at 1/20.

At this stage of the process, the remaining thickness of the silicon oxide film is about 70 nm. The thickness of the silicon at the bottom of the slits 41 etched during the etching of the silicon oxide film having a thickness of 70 nm is around 3.5 nm, and scarcely causes a substantial problem. The silicon oxide film 39 may be etched back using photoresist formed in the slits as a protective material therefor. Use of the photoresist as the protective material for the slits 41 may be preferably accompanied by forming a sacrificial layer having a thickness of several nanometers on the exposed surface of the silicon substrate. At this stage, the top surface of the isolation area 11 has a height substantially equal to the height of the fin active area 12c.

After removal of the silicon nitride film by heated phosphoric acid, a sacrificial layer is once formed and then removed. Thereafter, a 6-nm-thick silicon oxide film configuring the gate insulation film 25 is formed thereon using a thermal oxidation process. Thus, the top surface of fin active channel 12c and internal of the slits 41 are covered by the gate insulation film 25.

Thereafter, as shown in FIGS. 10 and 10A to 10D, an around-50-nm-thick doped polysilicon (DOPOS) film 14c including therein phosphorous (P) is deposited to fill the slits 41 with a first conductive material of the gate electrode 13. The DOPOS film 14c is deposited by a CVD technique using monosilane ($SiH_4$) and phosphine ($PH_3$) as a source gas. A 70-nm-thick tungsten film 15a used as a second conductive material of the gate electrode 13 is then formed by sputtering onto the DOPOS film 14c. The top insulation film 16a including a 140-nm-thick silicon nitride film and an 80-nm-thick silicon oxide film is formed thereon by a plasma-enhanced CVD technique. It is preferable to form a tungsten silicide film and a tungsten nitride film before forming the tungsten film 15a, to thereby prevent reaction between the tungsten and the DOPOS. A photoresist mask 42 having thereon a gate electrode pattern is then formed on the tungsten film 15a by using a photolithographic technique.

Subsequently, as shown in FIGS. 11 and 11A to 11D, a hard mask 16 is formed by patterning the top insulation film 16a by using the photoresist mask 42 as an etching mask. Thereafter, the gate electrodes 13a, 13b including the DOPOS film 14 and tungsten film 15 are formed by patterning the tungsten film 15a and DOPOS film 14c by using the hard mask 16 as an etching mask.

An over-etching is performed in the patterning of the DOPOS film 14, whereby a portion of the DOPOS film 14 embedded in the slits 41 and exposed from the gate electrodes 13a, 13b is removed. As a result, a portion of the slits exposed from the gate electrodes 13 again forms empty slits 41. In this step, since the surface of the active area 12c is covered by the 6-nm-thick gate insulation film 25, a portion of the active area 12c that configures the source/drain diffused regions is not etched. In the over-etching of the DOPOS film 14, mixed gas plasma including therein hydrogen bromide (HBr), chlorine ($Cl_2$) and oxygen ($O_2$) is used. The ratio of etching rate of silicon to silicon oxide can be maintained at 100 to 150 based on the mixing ratio of gases. The thickness of the silicon oxide film etched during the etching of 100-nm-thick DOPOS film in the slits is around 1 nm, and thus there is substantially no possibility of undesirable penetration of the gate insulation film 25.

The series of etching performed as above removes the 80-nm-thick silicon oxide film configuring the top insulation film 16, to leave the silicon nitride film.

Subsequently, as shown in FIGS. 12 and 12A to 12D, a 20-nm-thick sidewall insulation film 17 is formed on the sidewall of the gate electrodes 13. Formation of the sidewall insulation film 17 is performed by depositing a silicon nitride film on the entire surface, followed by etch-back thereof. In this step, the slits 41 are filled with the insulation film 24, i.e., silicon nitride configuring the sidewall insulation film 17.

Thereafter, as shown in FIGS. 13 and 13A to 13D, the thick interlayer dielectric film 26 is formed on the entire surface. It is preferable that the material for the thick interlayer dielectric film 26 have a superior embedding performance, and a higher ratio of the etching rate with respect to silicon nitride used as the sidewall insulation film 17. Examples of such a material include silicon oxide, and BPSG (borophospho-silicate glass). After forming the thick interlayer dielectric film 26 on the entire surface, the top surface thereof is polished by a CMP technique for planarization thereof.

Subsequently, as shown in FIGS. 14 and 14A to 14D, a photoresist mask 42 having a contact hole pattern is formed on the thick interlayer dielectric film 26 by using a photolithographic technique. Dry etching of the thick interlayer dielectric (silicon oxide) film 26 is performed using the photoresist mask 42 as an etching mask, to form contact holes 22a, 22b. In the process for forming the contact holes 22a, 22b, the sidewall insulation film 17 serves as a stopper, to form the contact holes in self-alignment with the gate electrodes 13. In an alternative process, the pattern of the photoresist mask 42 may be first transferred to a hard disk made of amorphous carbon, and dry etching is then performed onto the interlevel dielectric film by using the amorphous carbon as an etching mask. It is to be noted that the surface of the sidewall insulation film 17 made of silicon nitride, insulation film 23 embedded in the slits 41 and silicon substrate in the active area 12c is exposed from the bottom of contact holes 22a, 22c at this stage, as shown in FIG. 14.

Subsequently, as shown in FIGS. 15 and 15A to 15D, exposed surface of the active area 12c is subjected to an anisotropic dry etching using a higher selective etching rate for silicon, to thereby form bottom contact holes 22c having a thickness of 70 nm and extending from the bottom of contact holes 22a, 22b. This dry etching uses mixed gas plasma including hydrogen bromide (HBr), chlorine ($Cl_2$) and oxygen ($O_2$). The bottom contact holes 22c extends perpendicular to the surface of active area 12c. As shown in FIG. 15, the shape of circumferential surface of the bottom contact holes 22c opposing the fin channel 12b (or gate electrode 13) is defined by the outer surface of the sidewall insulation film 17 of the gate electrode 13. The dry etching proceeds in a vertical direction from the outer surface of the sidewall insulation film 17, whereby the surface of bottom contact holes 22c opposing the fin channel 12b is perpendicular to the top surface of the active area 12c and parallel to the second direction or extending direction of the gate electrodes 13.

Thereafter, as shown in FIGS. 16 and 16A to 16D, a 100-nm-thick DOPOS including $4 \times 10^{20}$ atoms/$cm^3$ of phosphorous (P) is deposited on the entire surface, polished by a CMP technique, and patterned to leave contact plugs 20a, 21a within the contact holes 22a, 22b, 22c. The embedded contact plugs 20b, 21b filling the bottom contact holes 22c have a shape of substantially rectangular post or pillar. Subsequently, a heat treatment is performed at 800 degrees C. for 20 seconds, to thereby diffuse phosphorous from the DOPOS film toward the silicon substrate 10 and form the source/drain diffused regions 20, 21.

The thickness of the diffused regions may be controlled by a combination of the temperature and time length, and set at 20 nm in this embodiment which is equivalent to the thickness of the sidewall insulation film 17. The total length of the embedded contact plugs may be 70 nm, and the thickness of sidewall insulation film 17 may be 20 nm, whereby the depth of the bottom of diffused regions is 90 nm as measured from the top surface of the active area and is smaller than the depth (100 nm) of slits. If the depth of bottom of the diffused regions exceeds the depth (H) of the slits, the depletion layer will extend toward an area at which the electric field generated by the sidewall electrodes of gate electrode 13 cannot well control the depletion layer. This may cause the problem of punch-through. The problem of punch-through can be avoided by the configuration wherein the depth of bottom of the diffused regions does not exceed the depth of slits.

Subsequent process includes the steps of forming bit lines and bit-line contact plugs, forming capacitor contact plugs and capacitor, etc before obtaining the final product of the DRAM device.

As described heretofore, the bottom contact holes 22c extend perpendicular to the top surface of the active area, and the circumferential surface of the bottom contact holes 22c opposing the fin channel is parallel to the second direction which coincides with the extending direction of the gate electrodes 13. This configuration allows the structure wherein the embedded contact plugs 20b, 21b and source/drain diffused regions 20, 21 formed from the contact plugs 20b, 21b extend perpendicular to the top surface of the active area 12c, and the surface of these elements opposing the fin channel is parallel to the second direction, i.e., extending direction of the gate electrodes.

In the above configuration, the effective channel length L2 is constant with respect to the depth-wise direction. In addition, as compared to the conventional method wherein the source/drain diffused regions are formed by diffusion of impurities from the top surface of the silicon substrate, the present embodiment provides the source/drain diffused regions at an accurate position in the active area. The accurate position allows an effective use of the fin channel 12b in the vertical direction depending on the structure of the fin channel, and provides a larger effective width for the fin channel.

In the present embodiment, the source/drain diffused regions 20, 21 are formed by diffusion of impurities only from the embedded contact plugs 20b, 21b, without using an ion implantation. This reduces the damage of silicon crystal, reduces the leakage current and thereby improves the refresh characteristic of the DRAM device.

Since the bottom contact holes 22c formed in the active area 12c are tilled with the embedded contact plugs 20b, 21b in the present embodiment, the contact area between the embedded contact plugs 20b, 21b and the diffused regions can be enlarged in the depth-wise direction. The increased contact area reduces the contact resistance as compared to the case where the contact plugs contact only the top surface of the active area.

In the present embodiment, a polysilicon film doped with phosphorous (P), i.e., DOPOS film is used for the embedded contact plugs 20b, 21b. An LP (low pressure)-CVD process using monosilane and phosphine as a source gas and a deposition temperature of 600 degrees C. or above provides a perfect polycrystalline state for the deposited silicon film. The as-deposited silicon film in a polycrystalline is state generally has a higher electric resistance due to a smaller grain size of silicon. On the other hand, an LPCVD process using the same source gas and yet a lower temperature of 540 degrees C. or below provides a non-amorphous state for the as-deposited silicon. The non-amorphous silicon has a significantly higher electric resistance; however, a subsequent heat treatment of the non-amorphous silicon provides a polycrystalline state having a larger grain size for the resultant silicon film as compared to the as-deposited polycrystalline silicon. Thus, a lower electric resistance can be obtained in the resultant silicon film.

In view of the above, it is preferable that the DOPOS film to be used for the embedded contact plugs be deposited in a non-amorphous state and then heat treated for polycrystallization during the heat treatment for forming the diffused regions. In an alternative, the heat treatment for the polycrystallization may be other than the heat treatment for the diffused regions. The heat treatment may be preferably performed at a temperature of 650 degrees C. or higher. The embedded contact plugs have a higher specific resistance as compared to the ordinary contact plugs not embedded in the silicon substrate. Thus, in a view point of higher-speed operation for the semiconductor device, embedded contact plugs should have a lower resistance by using the above process.

FIGS. 17, 17A to 17D show a DRAM device according to a modification from the first embodiment, depicting the structure of contact plugs therein at a step similar to the step of FIGS. 16, 16A to 16B. This modification shows a technique for reduction of the electric resistance of contact plugs. After forming bottom contact holes 22c in the step of FIG. 15 etc., the DOPOS film is formed to fill the bottom contact holes 22c while leaving a portion of the contact holes 22a, 22b empty. More specifically, the deposition of DOPOS film is performed to a depth corresponding to half the width of the smaller side of the contact holes 22a, 22b, whereby the bottom contact holes 22c are filled with the DOPOS film while leaving empty the top portion of the contact holes 22a, 22b having a larger diameter.

After depositing the DOPOS film, a metallic film is deposited to fill the remaining portion of the contact holes 22a, 22b. The DOPOS film and metallic film outside the contact holes are then removed by a CMP process, to thereby obtain contact plugs 20a, 21a including therein metallic plugs 43a, 43b at the central portion of the contact plugs 20a, 21a. As is well known, the metallic film has a resistance as low as 1/10 or below the resistance of the DOPOS film, the modification provides a lower overall resistance for the contact plugs.

FIGS. 18 and 18A to 18D show, similarly to FIGS. 17 and 17A to 17D, a semiconductor device according to another modification from the first embodiment. This modification shows another technique for reducing the electric resistance of contact plugs. The modification uses the steps up to the step of FIG. 16 etc. After forming the DOPOS film to fill the contact holes 22a, 22b, a selective dry etching is performed to the DOPOS film by using mixed gas plasma including hydrogen bromide (HBr), chlorine ($Cl_2$) and oxygen ($O_2$), thereby etching back the DOPOS film. The level of the remaining portion of DOPOS film is below the top surface of the silicon substrate in the active area. Thereafter, a barrier metal film such as made of titanium silicide or titanium nitride is deposited to fill the remaining portion of contact holes corresponding to the etched portion of the DOPOS film. Thus, the contact plugs have a two-layer structure including an upper metallic plug 44a, 44b and a lower DOPOS plug. This modification provides a lower electric resistance for the contact plugs compared to the modification of FIG. 17 etc. because the volume ratio of metallic film to the total volume in the contact holes may be increased.

Figure 19:
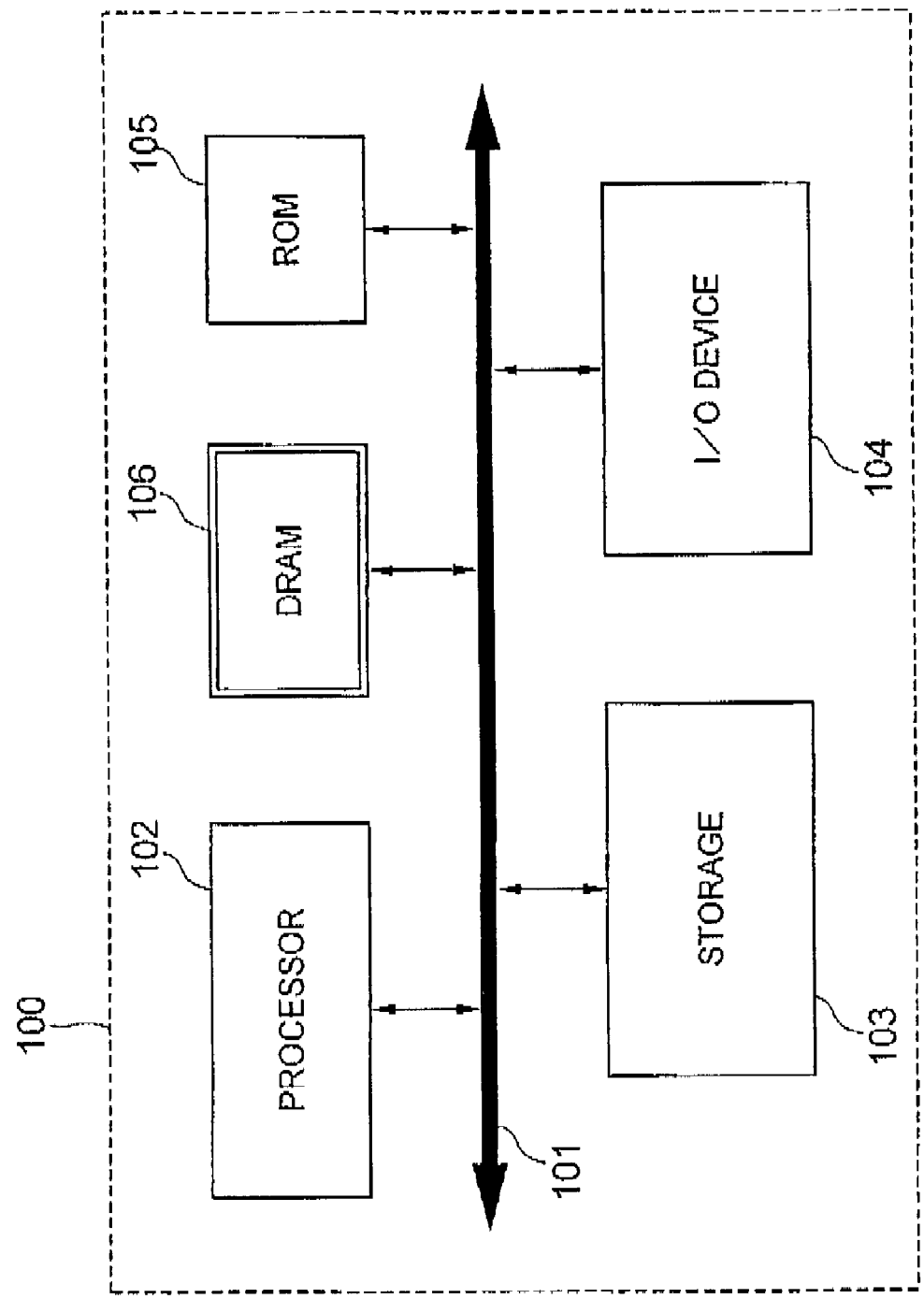
FIG. 19 is a block diagram of a data processing system according to a second embodiment of the present invention.
Figure 20A:
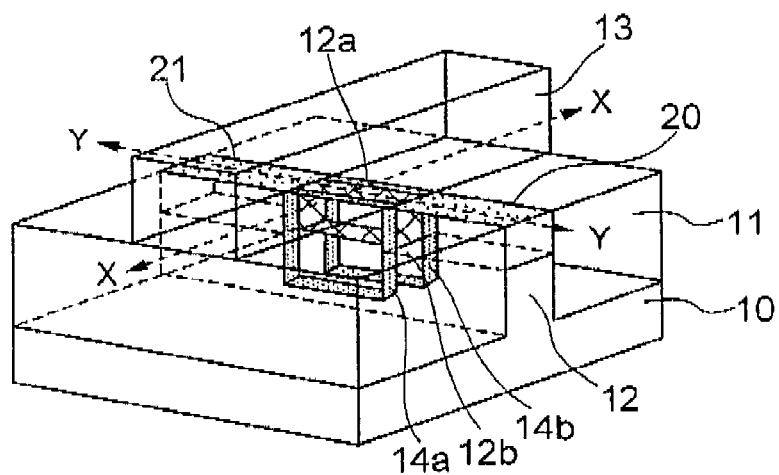
FIG. 20A is a perspective view of a semiconductor device described in a patent publication.
Figure 20B:
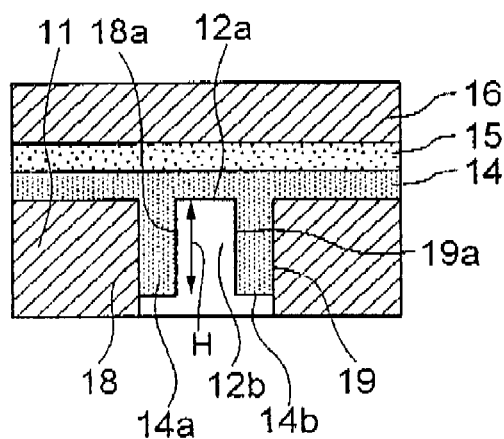
FIGS. 20B and 20C are sectional views taken along lines X-X and Y-Y, respectively, in FIG. 20.
Figure 20C:
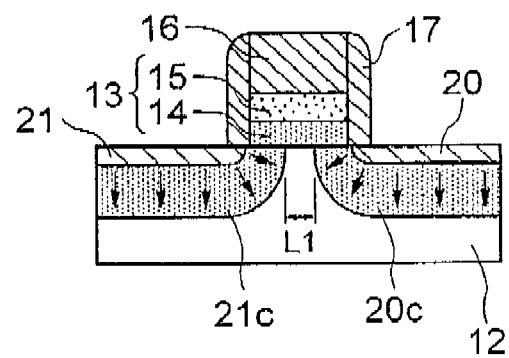

FIG. 19 is a block diagram of a data processing system according to a second embodiment of the present invention. The data processing system 100 of the present embodiment is configured by a computer system; however, the configuration of the embodiment is not limited to the computer system. The data processing system 100 includes a processor 102, and a DRAM device 106 including a semiconductor device according to an embodiment of the present invention. The processor 102 includes, for example, a micro-processor (MPU), digital signal processor (DSP) etc., although not limited thereto. In FIG. 19, the processor 102 is connected to the DRAM device 106 via a system bus 101. In an alternative, the process 102 may be connected to the DRAM device 106 via a local bus. In FIG. 19, a single system bus 101 is depicted for the purpose of simplification, a plurality of system buses may be used by coupling them together by a connector etc. in serial or parallel connection.

Although a storage device 103, an I/O device 104, and a ROM 105 are connected to the system bass 101 of the data processing system 100 in the drawing, each of thedr constituent elements is not an indispensable element. The I/O device 104 may include therein a display unit, such as a liquid crystal display unit, for example, although it is not indispensable. The I/O device 104 may include one of an output device and an input device. The present invention is not limited to a DRAM device and may be applied to other memory devices or a logic device, although the above embodiment is directed to the DRAM device.

While the invention has been particularly shown and described with reference to exemplary embodiment and modifications thereof, the invention is not limited to these embodiment and modifications. It will be understood by those of ordinary skill in the art that various changes in form and details may be made therein without departing from the spirit and scope of the present invention as defined in the claims.

What is claimed is:

1. A semiconductor device comprising:
    a semiconductor substrate including an active area isolated by an isolation area;
    a gate electrode extending across said active area;
    source and drain regions disposed in said active area in association with said gate electrode, including an impurity-containing conductive plug embedded therein; and
    a vertical layer area disposed between said active area and said isolation area, comprising electrode portions connected to said gate electrode and isolation portions adjacent to a sidewall of said electrode portions, wherein
    said electrode portions flank said active area at an intersection of said active area and said gate electrode, such that the top and side surfaces of said active area at said intersection are covered by said gate electrode and said electrode portions, respectively, and
    said isolation portions flanks said active area at said source and drain regions.

2. The semiconductor device according to claim 1, wherein said electrode portions configure a channel extending between said source region drain regions.

3. The semiconductor device according to claim 1, wherein said impurity-containing conductive plug is formed in self-alignment with a sidewall insulation film formed on a sidewall of said gate electrode.

4. A semiconductor device comprising:
    a semiconductor substrate including an active area isolated by an isolation area:
    a gate electrode extending across said active area; and
    source and drain regions disposed in said active area in association with said gate electrode, wherein
    each of said source and drain regions comprises an impurity-containing conductive plug embedded therein,
    a vertical layer area is provided between said active area and said isolation area,
    said active area and said vertical layer area extend in a first direction, and said gate electrode extends in a second direction intersecting said first direction,
    said vertical layer area includes a first vertical layer area portion filled with a conductive material configuring a portion of said gate electrode, and a second vertical layer area portion filled with an insulation material and disposed adjacent to said first vertical layer area portion and said source and drain regions, and
    said source and drain regions each have a bottom located above a bottom of said vertical layer area.

5. The semiconductor device according to claim 1, wherein said impurity-containing conductive plug is connected to an interconnection overlying said semiconductor substrate.

6. The semiconductor device according to claim 1, wherein said impurity-containing conductive plug has a substantially square bottom.

7. A DRAM device including a semiconductor device according to claim 1.

8. A data processing system including the DRAM device according to claim 7.

* * * * *